(12) United States Patent
Lee et al.

(10) Patent No.: US 7,990,484 B2
(45) Date of Patent: Aug. 2, 2011

(54) THIN FILM TRANSISTOR ARRAY PANEL FOR LIQUID CRYSTAL DISPLAY AND METHOD FOR MANUFACTURING THE SAME

(75) Inventors: Chang-Hun Lee, Suwon (KR);
Nam-Hung Kim, Suwon (KR);
Hak-Sun Chang, Seoul (KR); Jae-Jin Lyu, Kyungki-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1022 days.

(21) Appl. No.: 11/697,122

(22) Filed: Apr. 5, 2007

(65) Prior Publication Data
US 2007/0190703 A1  Aug. 16, 2007

Related U.S. Application Data

(62) Division of application No. 10/432,833, filed on Nov. 12, 2003, now Pat. No. 7,209,192.

(51) Int. Cl.
*G02F 1/1343* (2006.01)

(52) U.S. Cl. .......................................... 349/39
(58) Field of Classification Search ............ 349/39
See application file for complete search history.

(56) References Cited

U.S. PATENT DOCUMENTS

| 5,745,195 | A | | 4/1998 | Zhang |
| 6,088,072 | A | * | 7/2000 | Lee ................................. 349/39 |
| 6,091,466 | A | | 7/2000 | Kim et al. |
| 6,356,318 | B1 | | 3/2002 | Kawahata |

(Continued)

FOREIGN PATENT DOCUMENTS

JP  03-072321  3/1991

(Continued)

OTHER PUBLICATIONS

English Abstract for Publication No. 03-294824.

(Continued)

*Primary Examiner* — James A Dudek
(74) *Attorney, Agent, or Firm* — F. Chau & Associates, LLC

(57) ABSTRACT

In a method of fabricating a liquid crystal display, an insulating layer for storage capacitors is reduced in thickness to increase the storage capacity while maintaining the aperture ratio in a stable manner. A thin film transistor array panel for the liquid crystal display includes an insulating substrate, and a gate line assembly and a storage capacitor line assembly formed on the insulating substrate. The gate line assembly has gate lines and gate electrodes. A gate insulating layer covers the gate line assembly and the storage capacitor line assembly. A semiconductor pattern is formed on the gate insulating layer. A data line assembly and storage capacitor conductive patterns are formed on the gate insulating layer overlaid with the semiconductor pattern. The data line assembly has data lines, source electrodes and drain electrodes. The storage capacitor conductive patterns are partially overlapped with the storage capacitor line assembly to thereby form first storage capacitors. A passivation layer covers the data line assembly, the storage capacitor conductive patterns and the semiconductor pattern. First and second contact holes are formed at the passivation layer while exposing the drain electrodes and the storage capacitor conductive patterns. Pixel electrodes are formed on the passivation layer while being connected to the drain electrodes and the storage capacitor conductive patterns through the first and the second contact holes. The pixel electrodes form second storage capacitors in association with parts of the storage capacitor line assembly.

5 Claims, 44 Drawing Sheets

U.S. PATENT DOCUMENTS

| | | |
|---|---|---|
| 6,788,357 B2 | 9/2004 | Moon |
| 7,206,033 B2 | 4/2007 | Yoo et al. |
| 7,292,302 B2 | 11/2007 | Min et al. |
| 7,351,621 B2 | 4/2008 | Moon |

FOREIGN PATENT DOCUMENTS

| | | |
|---|---|---|
| JP | 03-163529 | 7/1991 |
| JP | 03-294824 | 12/1991 |
| JP | 04-326329 | 11/1992 |
| JP | 05-034722 | 2/1993 |
| JP | 06-148681 | 5/1994 |
| JP | 08-328039 | 12/1996 |
| JP | 10-239699 | 9/1998 |
| JP | 2001-094112 | 4/2001 |
| JP | 2001-144301 | 5/2001 |
| KR | 1998-017626 | 6/1998 |
| KR | 100149312 | 6/1998 |
| KR | 1019990026576 | 4/1999 |
| KR | 10-0229677 | 8/1999 |
| KR | 100262404 | 5/2000 |
| KR | 100265573 | 6/2000 |
| KR | 10-2001-0001362 | 1/2001 |
| KR | 1020010001346 | 1/2001 |
| KR | 1020010026624 | 4/2001 |
| WO | WO 01/40857 | 6/2001 |

OTHER PUBLICATIONS

English Abstract for Publication No. 05-034722.
English Abstract for Publication No. 06-148681.
English Abstract for Publication No. 10-239699.
English Abstract for Publication No. 10-0229677.
English Abstract for Publication No. 1020010001362.
English Abstract for Publication No. 04-326329.
English Abstract for Publication No. 100219119 (for 1998-017626).
English Abstract for Publication No. 100262404.
English Abstract for Publication No. 100265573.
English Abstract for Publication No. 1020010001346.
English Abstract for Publication No. 1020010026624.
English Abstract for Publication No. 100149312.
English Abstract Publication No. 1019990026576.
English Abstract for Publication No. 2001-094112.
English Abstract for Publication No. 2001-144301.
English Abstract for Publication No. 08-328039.
English Abstract for Publication No. 03-163529.
English Abstract for Publication No. 03-072321.
English Abstract for Publication No. WO 01/40857.

* cited by examiner

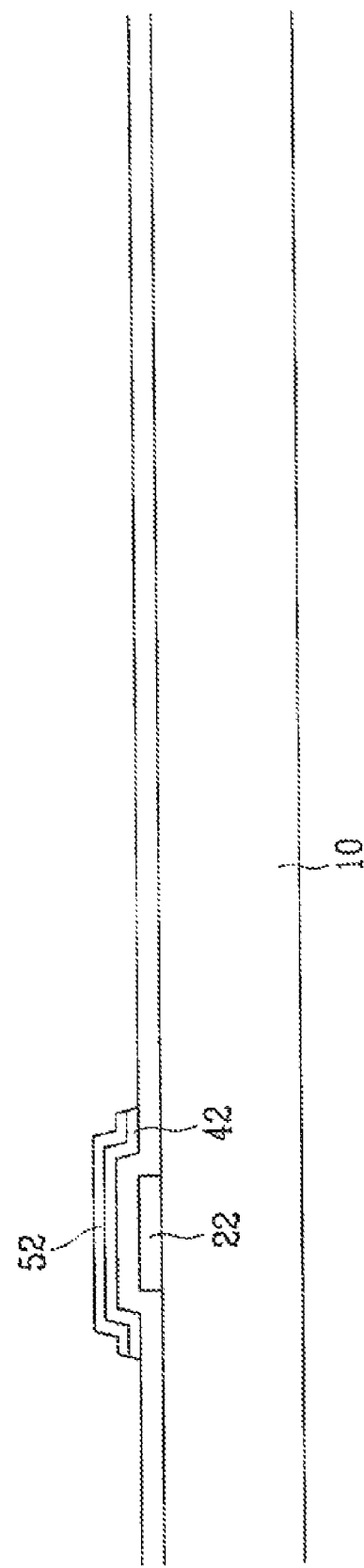

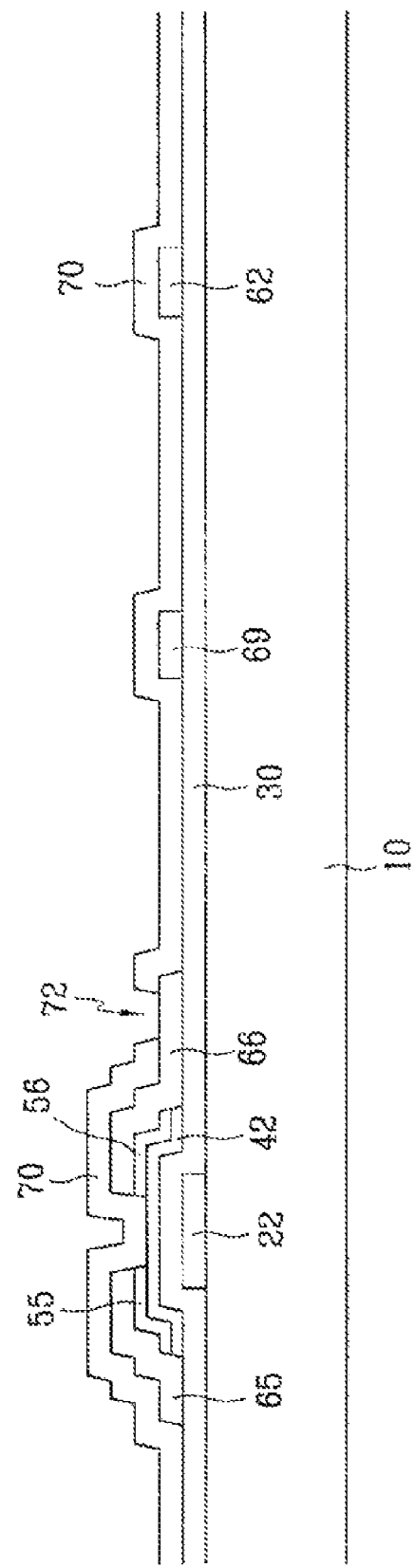

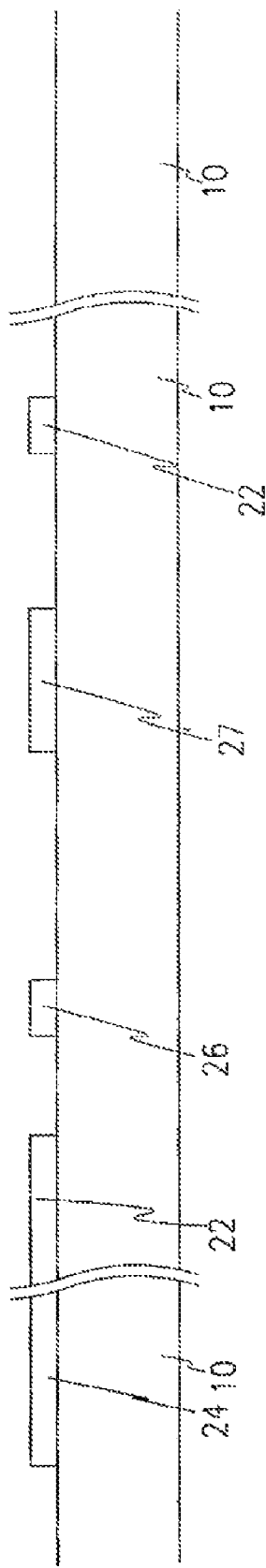

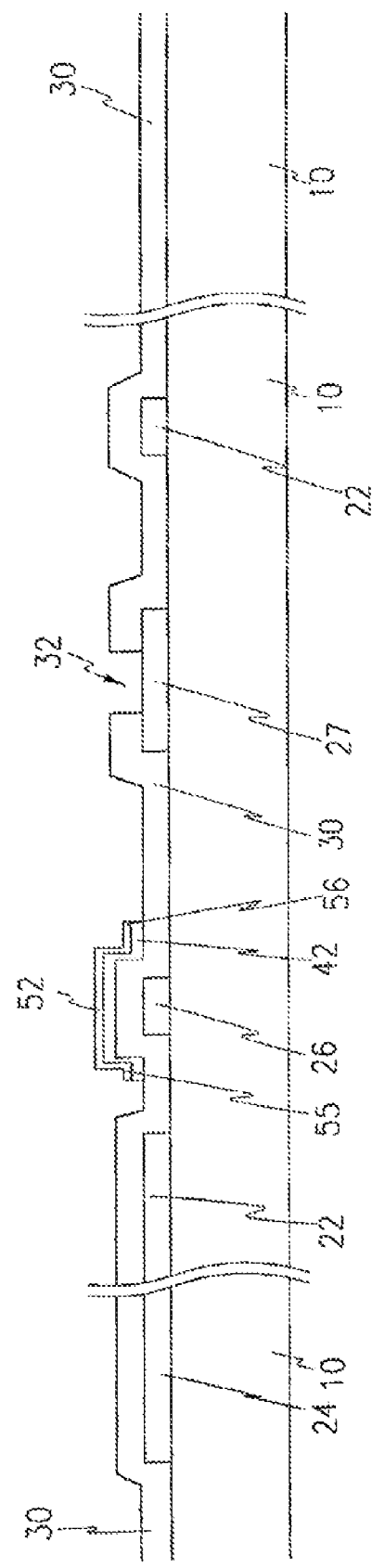

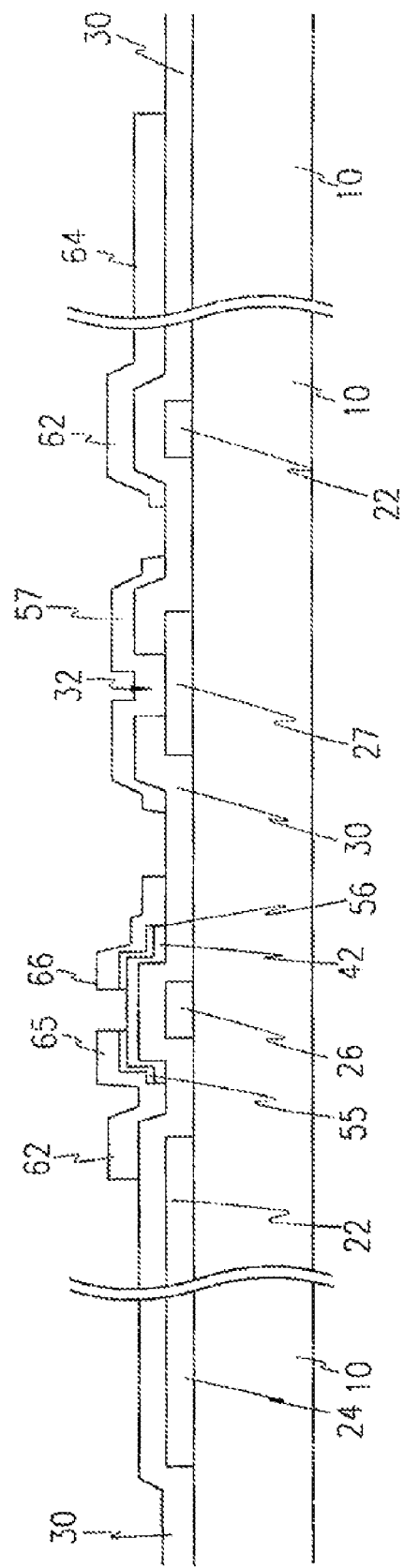

THIN FILM TRANSISTOR ARRAY PANEL FOR LIQUID CRYSTAL DISPLAY AND METHOD FOR MANUFACTURING THE SAME

CROSS REFERENCE TO PRIOR APPLICATION

This application is a Divisional Application from a U.S. patent application Ser. No. 10/432,833 filed Nov. 12, 2003 now U.S. Pat. No. 7,209,192 which is herein specifically incorporated by reference in its entirety.

BACKGROUND OF THE INVENTION (a) Field of the Invention

The present invention relates to a thin film transistor array panel for a liquid crystal display, and a method for manufacturing the same.

(b) Description of the Related Art

Generally, a liquid crystal display has two substrates with electrodes, and a liquid crystal layer sandwiched between the two substrates. Voltages are applied to the electrodes so that the liquid crystal molecules in the liquid crystal layer are re-oriented to thereby control the light transmission. The electrodes may be all formed at one of the substrates. One of the substrates is called the "thin film transistor array panel", and the other is called the "color filter substrate."

The thin film transistor array panel has a plurality of gate lines, data lines crossing over the gate lines while defining pixel regions, thin film transistors formed at the respective pixel regions while being electrically connected to the gate and the data lines, and pixel electrodes electrically connected to the thin film transistors, Storage capacitors are formed at the thin film transistor array panel to keep the voltage applied to the liquid crystal disposed between the two substrates in a stable manner. For that purpose, a storage capacitor line assembly is formed at the same layer as the gate lines such that it is overlapped with the pixel electrodes to thereby form storage capacitors. Meanwhile, the electrostatic capacitance of the storage capacitors should be increased to enhance the brightness of the display device or to make rapid response speed thereof. In this connection, it is necessary to enlarge the area of the storage capacitor line assembly, but this causes decreased aperture or opening ratio.

SUMMARY OF THE INVENTION

It is an object of the present invention to provide a thin film transistor array panel for a liquid crystal display which involves storage capacitors with increased electrostatic capacitance while bearing a reasonable aperture ratio.

This and other objects may be achieved by a thin film transistor array panel for a liquid crystal display where the storage capacitor line assembly is formed at the same layer as the data lines, or the thickness of the insulating layer for the storage capacitors is minimized.

According to one aspect of the present invention, the thin film transistor array panel includes an insulating substrate, and a gate line assembly formed on the insulating substrate and including gate lines, and gate electrodes. A gate insulating layer covers the gate line assembly. A semiconductor pattern is formed on the gage insulating layer. A data line assembly is formed on the gate insulating layer overlaid with the semiconductor pattern. The data line assembly has data lines crossing over the gate lines, source electrodes connected to the data lines and the semiconductor pattern, and drain electrodes facing the source electrodes and connected to the semiconductor pattern. Storage capacitor electrode lines are formed between the neighboring data lines while crossing over the gate lines. A passivation layer covers the data line assembly, the storage capacitor electrode lines and the semiconductor pattern while bearing contact holes exposing the drain electrodes. Pixel electrodes are formed on the passivation layer while being connected to the drain electrodes through the contact holes. The pixel electrodes are overlapped with the storage capacitor electrode lines.

The thin film transistor array panel may further include a common interconnection line commonly interconnecting the storage capacitor electrode lines. The common interconnection line may be formed with the same material as the pixel electrodes or the gate lines while crossing over the data lines in an insulated manner.

The passivation layer has a plurality of contact holes exposing the storage capacitor electrode lines, and the common interconnection line is connected to the storage capacitor electrode lines through the contact holes. A subsidiary interconnection line may be connected to the storage capacitor electrode lines. The storage capacitor electrode lines and the subsidiary interconnection line are formed with the same material.

Gate pads are formed at one-sided end portions of the gate lines, and data pads are formed at one-sided end portions of the data lines. First contact holes are formed at the passivation layer and the gate insulating layer while exposing the gate pads, and second contact holes are formed at the passivation layer while exposing the data pads. Subsidiary gate and data pads are connected to the gate and the data pads through the first and the second contact holes.

In addition to the above-structured thin film transistor array panel, the liquid crystal display includes a counter substrate facing the thin film transistor array panel, and a liquid crystal layer sandwiched between the thin film transistor array panel and the counter panel. The liquid crystal display has storage capacitors with an electrostatic capacitance greater than the electrostatic capacitance of the liquid crystal capacitor having the liquid crystal layer by 90% or more.

According to another aspect of the present invention, the thin film transistor array panel includes an insulating substrate, and a gate line assembly and a storage capacitor line assembly formed on the insulating substrate. The gate line assembly has gate lines and gate electrodes. A gate insulating layer covers the gate line assembly and the storage capacitor line assembly. A semiconductor pattern is formed on the gate insulating layer. A data line assembly and storage capacitor conductive patterns are formed on the gate insulating layer overlaid with the semiconductor pattern. The data line assembly has data lines, source electrodes and drain electrodes. The storage capacitor conductive patterns are partially overlapped with the storage capacitor line assembly to thereby form first storage capacitors. A passivation layer covers the data line assembly, the storage capacitor conductive patterns and the semiconductor pattern. First and second contact holes are formed at the passivation layer while exposing the drain electrodes and the storage capacitor conductive patterns, respectively. Pixel electrodes are formed on the passivation layer while being connected to the drain electrodes and the storage capacitor conductive patterns through the first and the second contact holes. The pixel electrodes form second storage capacitors in association with parts of the storage capacitor line assembly.

T he storage capacitor line assembly has storage capacitor electrode lines proceeding parallel to the gate lines, and storage capacitor electrode patterns connected to the storage capacitor electrode lines. The storage capacitor electrode patterns are overlapped with the storage capacitor conductive patterns to thereby form the first storage capacitors, and the storage capacitor electrode lines are overlapped with the pixel electrodes to thereby form the second storage capacitors.

The storage capacitor electrode patterns are formed within pixel regions defined by the gate lines and the data lines. The storage capacitor electrode patterns are formed with a bar shape along the data lines while being overlapped with peripheral portions of the pixel electrodes.

In addition to the above-structured thin film transistor array panel, the liquid crystal display includes a counter substrate facing the thin film transistor array panel, and a liquid crystal layer sandwiched between the thin film transistor array panel and the counter panel. The first and the second storage capacitors have an electrostatic capacitance greater than the electrostatic capacitance of the liquid crystal layer by 90% or more.

According to still another aspect of the present invention, the thin film transistor array panel includes an insulating substrate, and a gate line assembly formed on the insulating substrate. The gate line assembly has first gate lines, gate electrodes connected to the first gate lines, and second gate lines spaced apart from the first gate lines with a predetermined distance. A gate insulating layer covers the gate line assembly. A semiconductor pattern is formed or the gate insulating layer while being overlapped with the gate electrodes. A data line assembly and storage capacitor conductive patterns are formed on the gate insulating layer overlaid with the semiconductor pattern. The data line assembly has data lines crossing over the first and the second gate lines, source electrodes and drain electrodes. The storage capacitor conductive patterns are partially overlapped with the second gate lines to thereby form first storage capacitors. A passivation layer covers the data line assembly, the storage capacitor conductive patterns and the semiconductor pattern. First and second contact holes are formed at the passivation layer while exposing the drain electrodes and the storage capacitor conductive patterns, respectively. Pixel electrodes are formed at the passivation layer while being connected to the drain electrodes and the storage capacitor conductive patterns through the first and the second contact holes. The pixel electrodes are partially overlapped with the second gate lines to thereby form second storage capacitors.

In addition to the above structured thin film transistor array panel, the liquid crystal display includes a counter substrate facing the thin film transistor array panel, and a liquid crystal layer sandwiched between the thin film transistor array panel and the counter panel. The first and the second storage capacitors have an electrostatic capacitance greater than the electrostatic capacitance of the liquid crystal layer by 90% or more.

According to still another aspect of the present invention, the thin film transistor array panel includes an insulating substrate, and a gate line assembly and storage capacitor electrode lines formed on the insulating substrate. The gate line assembly has gate lines and gate electrodes. A gate insulating layer covers the gate line assembly and the storage capacitor electrode lines. First contact holes are formed at the gate insulating layer while exposing the storage capacitor electrode lines. A semiconductor pattern is formed on the gate insulating layer while being overlapped with the gate electrodes. A data line assembly and storage capacitor conductive patterns are formed on the gate insulating layer overlaid with the semiconductor pattern. The data line assembly has data lines, source electrodes and drain electrodes. The storage capacitor conductive patterns are connected to the storage capacitor electrode lines through the first contact holes. A passivation layer covers the data line assembly, the storage capacitor conductive patterns and the semiconductor pattern. Second contact holes are formed at the passivation layer while exposing the drain electrodes. Pixel electrodes are formed at the passivation layer while being connected to the drain electrodes through the second contact holes. The pixel electrodes are overlapped with the storage capacitor conductive patterns to thereby form first storage capacitors while being partially overlapped with the storage capacitor electrode lines to thereby form second storage capacitors.

The storage capacitor electrode lines proceed parallel to the gate lines, and the storage capacitor conductive patterns are overlapped with the storage capacitor electrode lines. The storage capacitor conductive patterns are formed within pixel regions defined by the gate lines and the data lines. The storage capacitor electrode patterns are formed with a bar shape along the data lines while being overlapped with peripheral portions of the pixel electrodes.

In addition to the above-structured thin film transistor array panel, the liquid crystal display includes a counter substrate facing the thin film transistor array panel, and a liquid crystal layer sandwiched between the thin film transistor array panel and the counter panel. The first and the second storage capacitors have an electrostatic capacitance greater than the electrostatic capacitance of the liquid crystal layer by 90% or more.

According to still another aspect of the present invention, the thin film transistor array panel includes an insulating substrate, and a gate line assembly formed on the insulating substrate. The gate line assembly has first gate lines, gate electrodes connected to the first gate lines, and second gate lines spaced apart from the first gate lines with a predetermined distance. A gate insulating layer covers the gate line assembly. First contact holes are formed at the gate insulating layer while partially exposing the second gate lines. A semiconductor pattern is formed on the gate insulating layer while being overlapped with the gate electrodes. A data line assembly and storage capacitor conductive patterns are formed on the gate insulating layer overlaid with the semiconductor pattern. The data line assembly has data lines crossing over the first and the second gate lines, source electrodes and drain electrodes. The storage capacitor conductive patterns are connected to the second gate lines through the first contact holes. A passivation layer covers the data line assembly, the storage capacitor conductive patters and the semiconductor pattern. Second contact holes are formed at the passivation layer while exposing the drain electrodes. Pixel electrodes are formed at the passivation layer while being connected to the drain electrodes through the second contact holes. The pixel electrodes are overlapped with the storage capacitor conductive patterns to thereby form first storage capacitors while being partially overlapped with the second gate lines to thereby form second storage capacitors.

In addition to the above-structured thin film transistor array panel, the liquid crystal display includes a counter substrate facing the thin film transistor array panel, and a liquid crystal layer sandwiched between the thin film transistor array panel and the counter panel. The first and the second storage capacitors have an electrostatic capacitance greater than the electrostatic capacitance of the liquid crystal layer by 90% or more.

According to still another aspect of the present invention, in a method of fabricating a thin film transistor array panel, a gate line assembly and a storage capacitor line assembly are formed on an insulating substrate such that the gate line assembly has gate lines and gate electrodes. A gate insulating layer is formed on the substrate such that it covers the gate line assembly and the storage capacitor line assembly. A semiconductor pattern is formed on the gate insulating layer. A data line assembly and storage capacitor conductive patterns are formed on the gate insulating layer overlaid with the semiconductor pattern such that the data line assembly has data lines, source electrodes and drain electrodes, and the storage capacitor conductive patterns are partially overlapped with the storage capacitor line assembly to thereby form first storage capacitors. A passivation layer is formed on the substrate such that it covers the data line assembly, the storage capacitor conductive patterns and the semiconductor pattern. First and second contact holes are formed at the passivation layer such that they expose the drain electrodes and the storage capacitor conductive patterns, respectively. Pixel electrodes are formed on the passivation layer such that they are connected to the drain electrodes and the storage capacitor conductive patterns through the first and the second contact holes while forming second storage capacitors in association with parts of the storage capacitor lines assembly.

The storage capacitor line assembly has storage capacitor electrode lines proceeding parallel to the gate lines, and storage capacitor electrode patterns connected to the storage capacitor electrode lines.

according to still another aspect of the present invention, in a method of fabricating a thin film transistor array panel, a gate line assembly is formed on an insulating substrate such that it has first gate lines, gate electrodes connected to the first gate lines, and second gate lines spaced apart from the first patio lines with a predetermined distance while proceeding parallel to the first gate lines. A gate insulating layer is formed on the substrate such that it covers the gate line assembly. A semiconductor pattern is formed on the gate insulating layer such that it is overlapped with the gate electrodes. A data line assembly and storage capacitor conductive patterns are formed on the gate insulating layer overlaid with the semiconductor pattern such that the data line assembly had data lines crossing over the first and the second gate lines, source electrodes and drain electrodes, and the storage capacitor conductive patterns are partially overlapped with the second gate lines to thereby form first storage capacitors. A passivation layer is formed on the substrate such that it covers the data line assembly, the storage capacitor conductive patterns and the semiconductor pattern. First and second contact holes are formed at the passivation layer such that the first and the second contact holes expose the drain electrodes and the storage capacitor conductive patterns, respectively. Pixel electrodes are formed on the passivation layer such that they are connected to the drain electrodes and the storage capacitor conductive patterns through the first and the second contact holes while forming second storage capacitors in association with parts of the second gate lines.

According to still another aspect of the present invention, in a method of fabricating a thin film transistor array panel, a gate line assembly and storage capacitor electrode lines are formed on an insulating substrate such that the gate line assembly has gate lines and gate electrodes. A gate insulating layer is formed on the substrate such that it covers the gate line assembly and the storage capacitor electrode lines. First contact holes are formed at the gate insulating layer such that they expose the storage capacitor electrode lines. A semiconductor pattern is formed on the gate insulating layer such that it is overlapped with the gate electrodes. A data line assembly and storage capacitor conductive patterns are formed on the gate insulating layer overlaid with the semiconductor pattern such that the data line assembly has data lines, source electrodes and drain electrodes, and the storage capacitor conductive patterns are connected to the storage capacitor electrode lines through the first contact holes. A passivation layer is formed on the substrate such that it covers the data line assembly, the storage capacitor conductive patterns and the semiconductor pattern. Second contact holes are formed at the passivation layer such that they expose the drain electrodes. Pixel electrodes are formed on the passivation layer such that they are connected to the drain electrodes through the second contact holes. The pixel electrodes are overlapped with the storage capacitor conductive patterns to thereby form first storage capacitors while being partially overlapped with the storage capacitor electrode lines to thereby form second storage capacitors.

According to still another aspect of the present invention, in a method of fabricating a thin film transistor array panel, a gate line assembly is formed on an insulating substrate such that it has first gate lines, gate electrodes connected to the first gate lines, and second gate lines spaced apart from the first gate lines with a predetermined distance while proceeding parallel to the first gate lines. A gate insulating layer is formed on the substrate such that it covers the gate line assembly. First contact holes are formed at the gate insulating layer such that they partially expose the second gate lines. A semiconductor pattern is formed on the gate insulating layer such that it is overlapped with the gate electrodes. A data line assembly and storage capacitor conductive patterns are formed on the gate insulating layer overlaid with the semiconductor pattern such that the data line assembly has data lines crossing over the first and the second gate lines, source electrodes and drain electrodes, and the storage capacitor conductive patterns are connected to the second gate lines through the first contact holes. A passivation layer is formed on the substrate such that it covers the data line assembly, the storage capacitor conductive patterns and the semiconductor pattern. Second contact holes are formed at the passivation layer such that they expose the drain electrodes. Pixel electrodes are formed on the passivation layer such that they are connected to the drain electrodes through the second contact holes. The pixel electrodes are overlapped with the storage capacitor conductive patterns to thereby form first storage capacitors while being partially overlapped with the second gate lines to thereby form second storage capacitors.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIGS. 5B and 5C are cross sectional views of the thin film transistor array panel taken along the VB-VB' line and the VC-VC' line of FIG. 5A;

FIGS. 7B and 7C are cross sectional views of the thin film transistor array panel taken long the VIIB-VIIB' line and the VIIC-VIIC' line of FIG. 7A;

FIG. 20B is a cross sectional view of the thin film transistor array panel taken long the XXB-XXB' line of FIG. 20A;

FIG. 22B is a cross sectional view of the thin film transistor array panel taken long the XXIIB-XXIIB' line of FIG. 22A;

FIG. 23B is a cross sectional view of the thin film transistor array panel taken long the XXIIIB-XXIIIB' line of FIG. 23A;

DETAILED DESCRIPTION OF THE PREFERRED EMBODIMENTS

Preferred embodiments of this invention will be explained with reference to the accompanying drawings.

Figure 1:
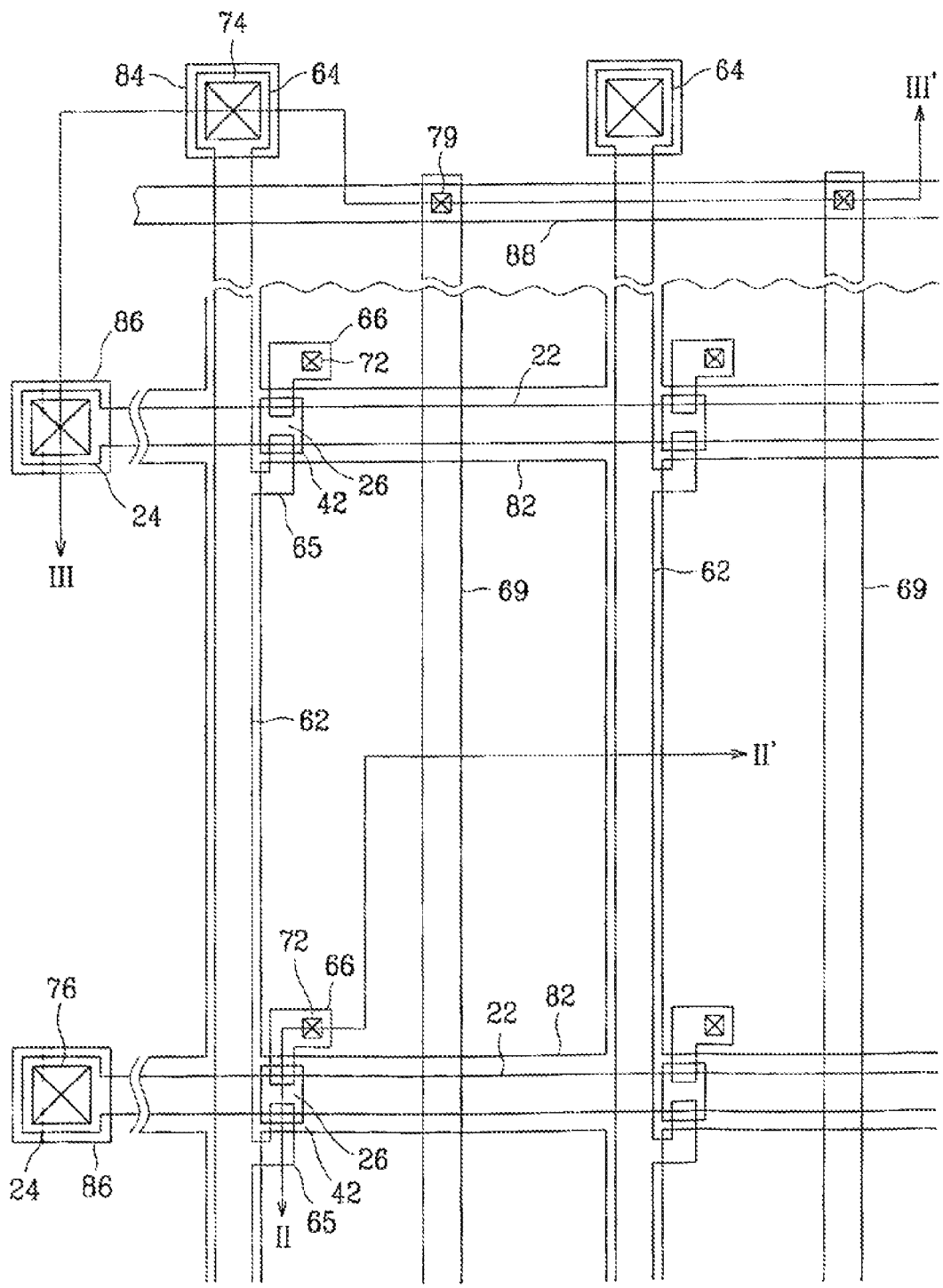
FIG. 1 is a plan view of a thin film transistor array panel according to a first preferred embodiment of the present invention.
Figure 2:
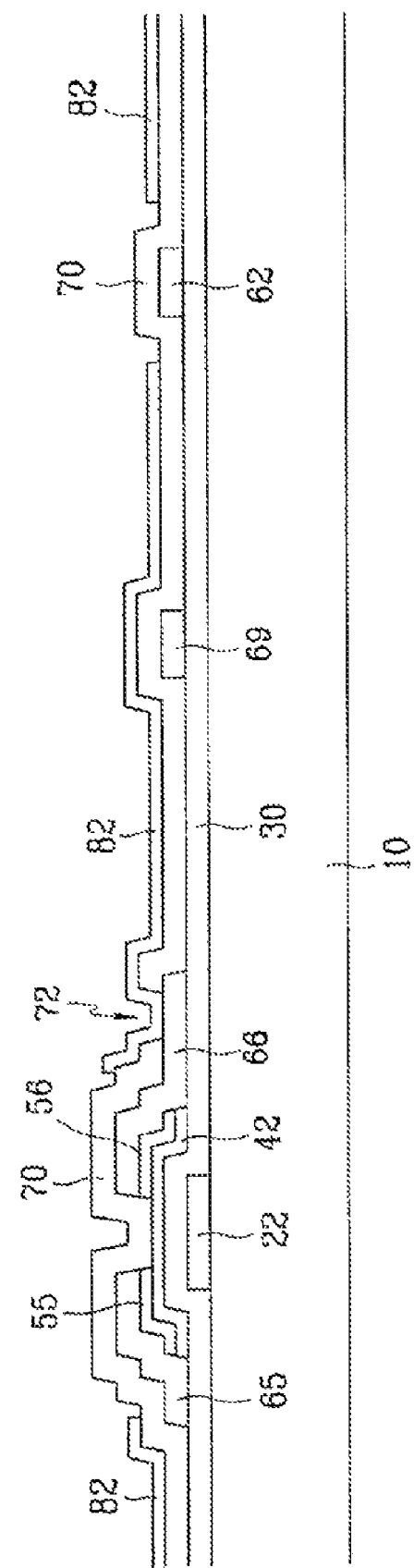
FIGS 2 and 3 are cross sectional views of the thin film transistor array panel taken along the II-II' line and the III-III' line of FIG. 1.
Figure 3:
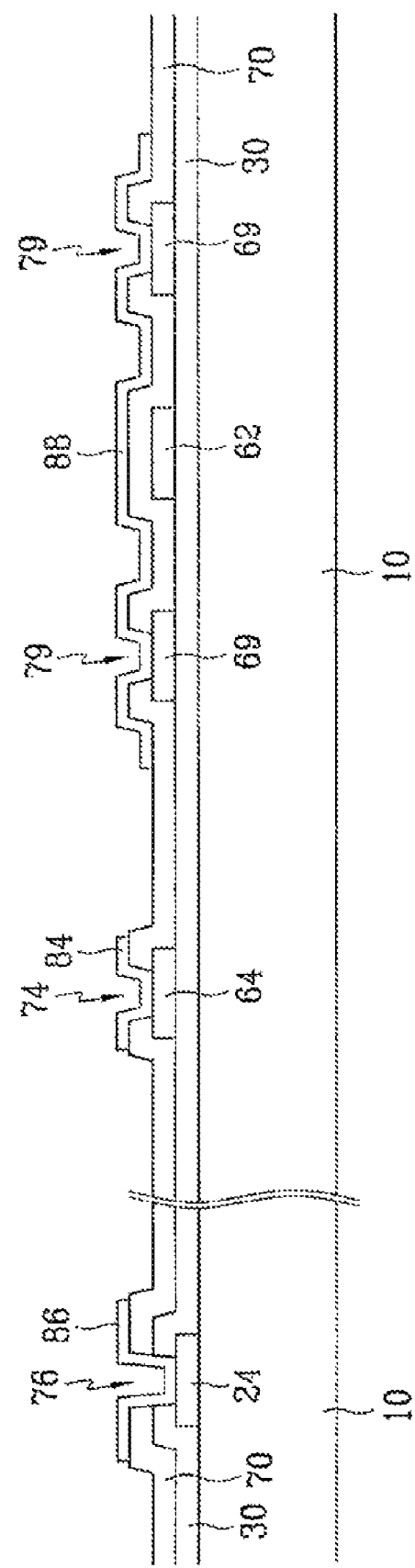

FIG. 1 is a plan view of a thin film transistor array panel for a liquid crystal display according to a first preferred embodiment of the present invention, and FIGS. 2 and 3 are cross sectional views of the thin film transistor array panel taken along the II-II' line and the III-III' line of FIG. 1.

A gate line assembly is formed on an insulating substrate 10 with a conductive material such as aluminum, aluminum alloy, chrome, chrome alloy, molybdenum, molybdenum alloy, chrome nitride, and molybdenum nitride while bearing a thickness of 1000-3500 Å. The gate line assembly includes gate lines 22 proceeding in the horizontal direction, gate pads 24 connected to the one-sided ends of the gate lines 22 while electrically contacting external driving circuits (not shown), and gate electrodes 26 being parts of the gate lines 22 while forming thin film transistors with other electrode components.

The gate line assembly may have a multiple-layered structure where one layer is formed with a low resistance metallic material, and the other layer with a material bearing a good contact characteristic with other materials.

A gate insulating layer 30 with a thickness of 2,500-4,500 Å is formed on the insulating substrate 10 with silicon nitride or silicon oxide while covering the gate line assembly.

A semiconductor pattern 42 with a thickness of 800-1500 Å is formed on the gate insulating layer 30 with amorphous silicon while being overlapped with the gate electrodes 26. Ohmic contact patterns 55 and 56 with a thickness of 500-800 Å are formed on the semiconductor pattern 42 with amorphous silicon where n type impurities are doped at high concentration.

A data line assembly and storage capacitor electrode lines 69 are formed on the ohmic contact patterns 55 and 56, and the gate insulating layer 30 with a conductive material such as aluminum, aluminum alloy, chrome, chrome alloy, molybdenum, molybdenum alloy, chrome nitride and molybdenum nitride while bearing a thickness of 500-3500 Å. The data line assembly includes data lines 62 proceeding in the vertical direction while crossing over the gate lines 22 to define pixel regions, data pads 64 connected to the one-sided ends of the data lines 62 while electrically contacting external driving circuits, source electrodes 65 connected to the data lines 62 while being extended over the ohmic contact pattern 55, and drain electrodes 66 facing the source electrodes 65 while being placed over the other ohmic contact pattern 56. The drain electrodes 66 are extended over the gate insulating layer 30 within the pixel regions.

The storage capacity electrode lines 69 are placed at the same plane as the data line assembly while proceeding in the vertical direction such that they are alternately arranged with the data lines 62. The storage capacity electrode lines 69 are overlapped with pixel electrodes 62 to thereby form storage capacitors.

The data line assembly may have a multiple-layered structure where at least one layer is formed with a low resistance metallic material.

A passivation layer 70 covers the data line assembly, the storage capacitor electrode lines 69 and the semiconductor pattern 42 while bearing a thickness of 500-2000 Å. The passivation layer 70 is formed with an insulating material such as silicon nitride and silicon oxide.

First and second contact holes 72 and 74 are formed at the passivation layer 70 while exposing the drain electrodes 66 and the data pads 64. Third contact holes 76 are formed at the passivation layer 70 while exposing the gate pads 24 together with the gate insulating layer 30. Furthermore, fourth contact holes 79 are formed at the passivation layer 70 while exposing the end portions of the storage capacitor electrode lines 69 sided with the data pads 64.

Pixel electrodes 82 are formed on the passivation layer 70 to receive picture signals and generate electric fields together with a common electrode (not shown) of the counter panel. The pixel electrodes 62 are electrically connected to the drain electrodes 66 through the first contact holes 72.

The pixel electrodes 82 are overlapped with the storage capacitor electrode lines 69 while interposing the passivation layer 70 to thereby form storage capacitors. As the passivation layer 70 disposed between the pixel electrodes 82 and the storage capacitor electrode lines 69 bears a thin thickness, the resulting storage capacitors bear a great electrostatic capacitance even when the storage capacitor electrode lines 69 bear a narrow width.

Subsidiary data pads 84 and subsidiary gate pads 86 are formed on the passivation layer 70 while being connected to the data pads 64 and the gate pads 24 through the second and the third contact holes 74 and 76. Furthermore, a common interconnection line 88 is formed external to the display area while proceeding parallel to the gate lines 22. The display area refers to the sum of the pixel regions. The common interconnection line 88 interconnects all of the storage capacitor electrode lines 69 through the fourth contact holes 79.

The pixel electrodes 82, the subsidiary data pads 84, the subsidiary gate pads 86 and the common interconnection line 88 are formed at the same plane with a transparent conductive material such as ITO and IZO.

The common interconnection line 88 may be formed with the same material as the gate line assembly during the process of forming the gate line assembly. In this case, a plurality of contact holes are formed at the gate insulating layer 30 while exposing the common interconnection line 88. The plurality of storage capacitor electrode lines 69 contact the common interconnection line 88 through the contact holes formed at the gate insulating layer 30.

Figure 4:
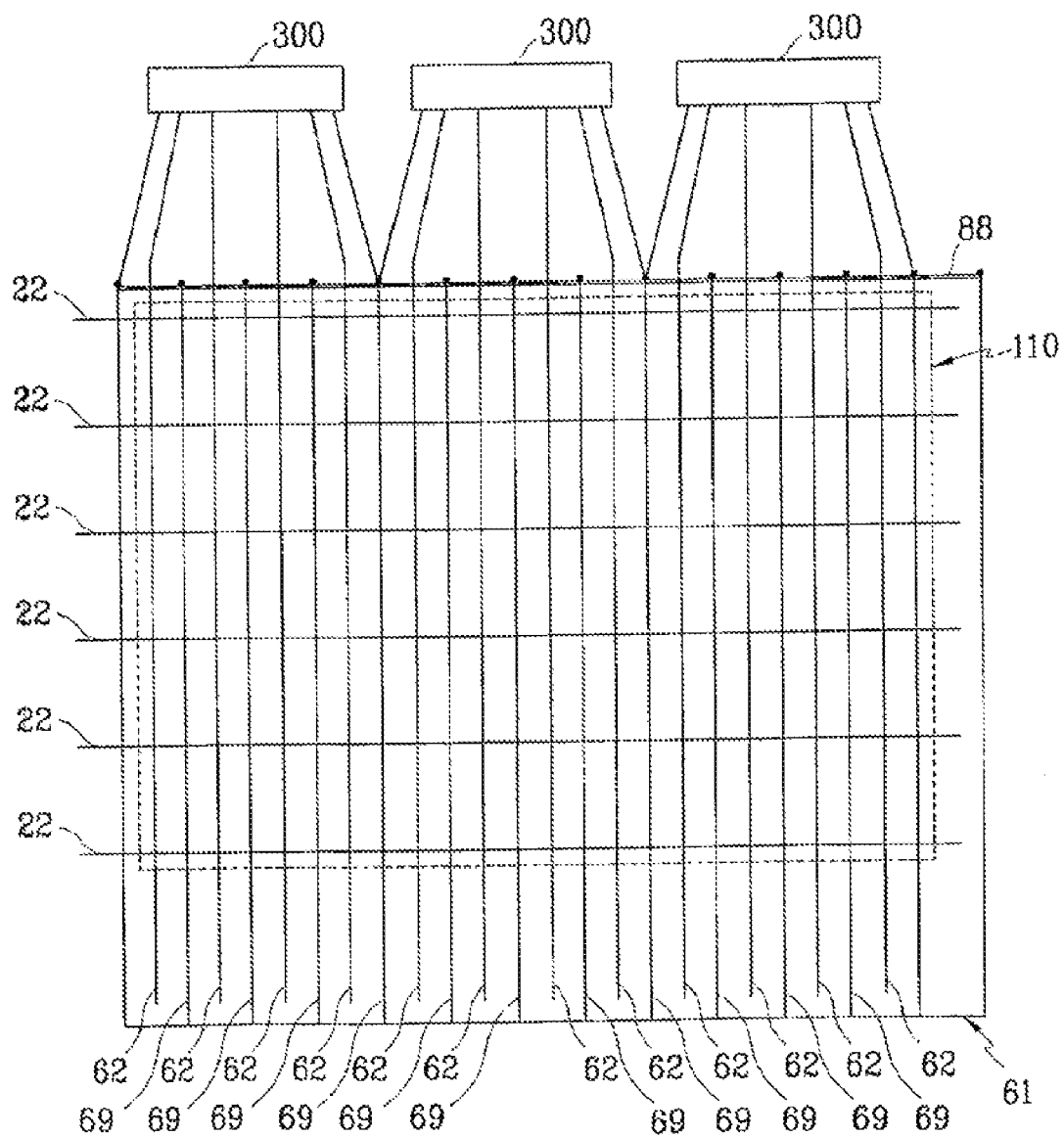
FIG. 4 illustrates the layout of gate lines, data lines and storage capacitor electrode lines at the thin film transistor array panel shown in FIG. 1.

FIG. 4 illustrates the arrangement of the gate lines, the data lines and the storage capacitor electrode lines at the thin film transistor array panel shown in FIG. 1.

As shown in FIG. 4, the plurality of gate lines 22 proceed in the horizontal direction parallel to each other, and the plurality of data lines 62 proceed in the vertical direction parallel to each other. The data lines 62 cross over the gate lines 22 while defining the pixel regions. The display area 110 refers to the sum of the pixel regions.

The one-sided end portions of the data lines 62 being the data pads are electrically connected to data driving circuits 300 to receive data signals from them. Similarly, the one-sided end portions of the gate lines 22 being the gate pads are electrically connected to gate driving circuits (not shown) to receive gate signals from them.

The storage capacitor electrode lines 69 are alternately arranged with the data lines 62. The storage capacitor electrode lines 69 are connected to each other by way of a subsidiary interconnection line 61 placed external to the display area 110. It is preferable that the storage capacitor electrode 69 and the subsidiary interconnection line 61 are formed with the same material while being commonly interconnected.

The common interconnection line 88 is placed at the ends of the storage capacitor electrode lines 69 sided with the data driving circuits while interconnecting all of the storage capacitor electrode lines 69. It is preferable that the common interconnection line 88 is formed with the same material as the pixel electrodes 82 or the gate line assembly. This is to prevent the common interconnection line 88 from being short circuited with the portions of the data lines 62 connected to the data driving circuits 300 external to the display area 110.

The storage capacitor electrode lines 69 are electrically connected to the data driving circuits 300 to receive common electrode voltages from them.

A method of fabricating the thin film transistor array panel will be now explained with reference to FIGS. 5A to &C as well as FIGS. 1 to 4.

Figure 5A:
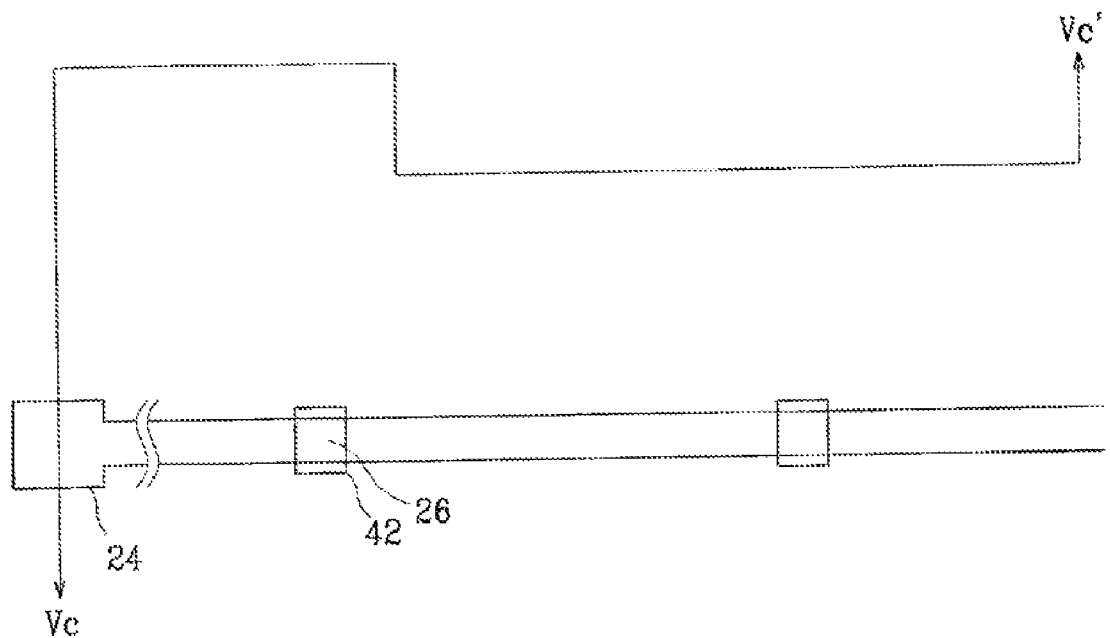
FIG. 5A illustrates the first step of fabricating the thin film transistor array panel shown in FIG. 1.
Figure 5A:
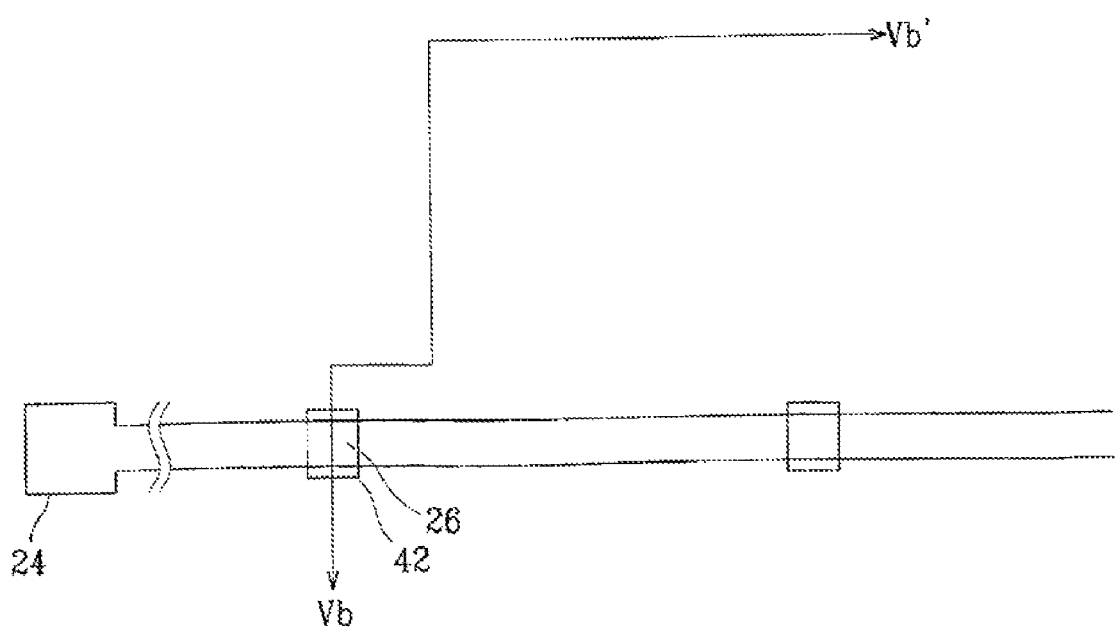
Figure 5C:
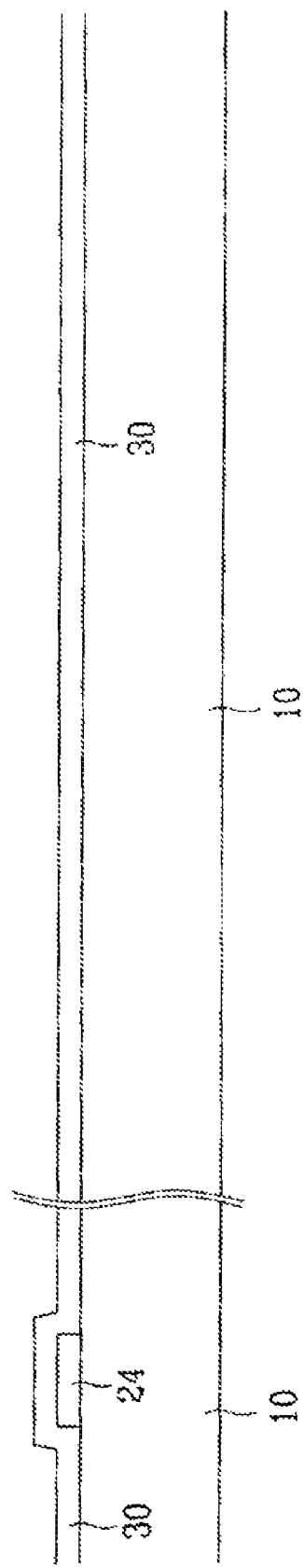

As shown in FIGS. 5A to 5C, a gate line assembly layer is deposited onto an insulating substrate 10, and patterned through photolithography to thereby form a gate line assembly. The gate line assembly includes gate lines 22, gate pads 24, and gate electrodes 26.

Thereafter, a gate insulating layer 30 based on an insulating material such as silicon nitride is deposited onto the insulating substrate 10 such that it covers the gate line assembly.

An amorphous silicon layer and a conductive type impurities-doped amorphous silicon layer are sequentially deposited onto the gate insulating layer 30, and patterned through photolithography to thereby form a semiconductor pattern 42 and an ohmic contact pattern 52.

Figure 6A:
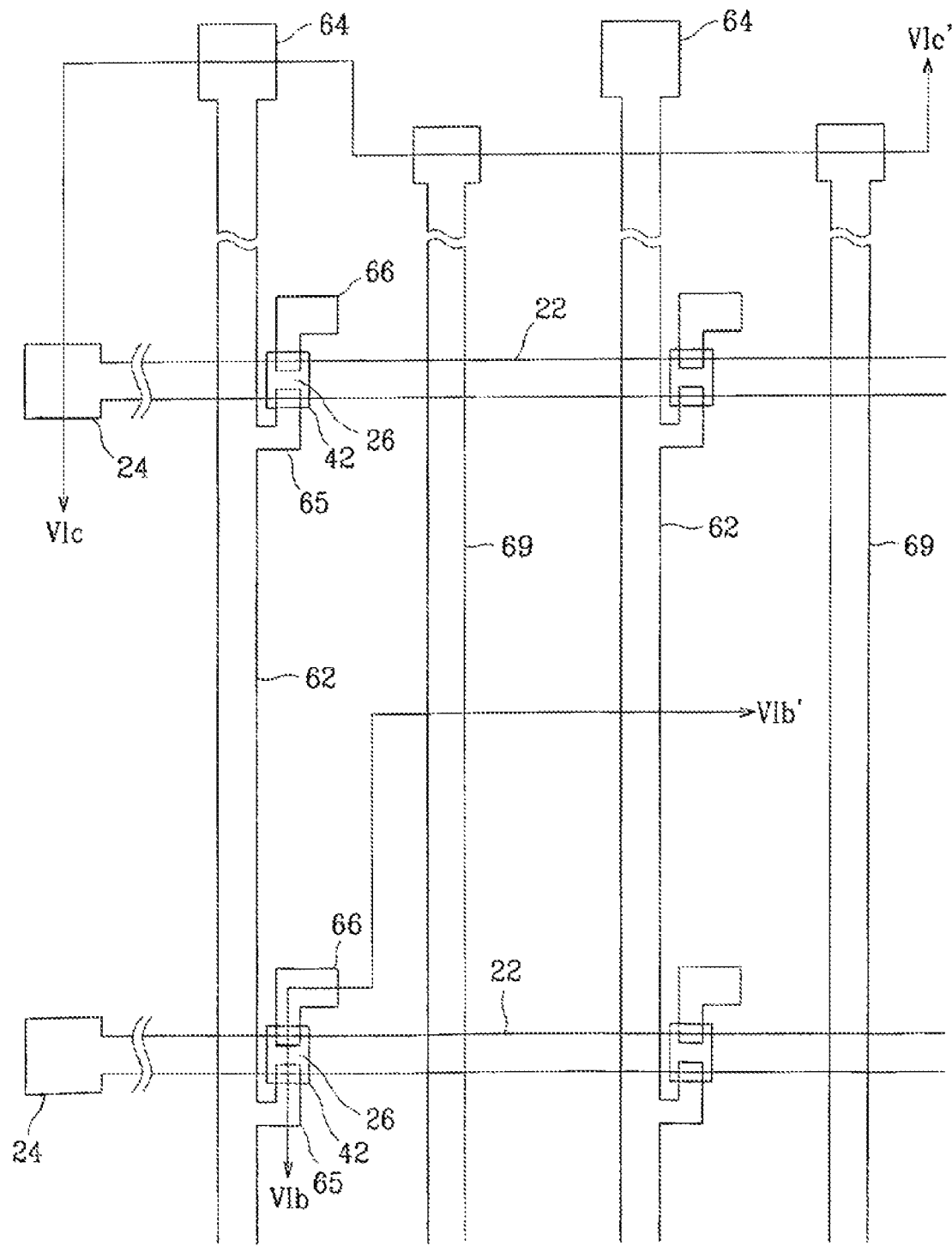
FIG. 6A illustrates the step of fabricating the thin film transistor array panel following the step illustrated in FIG. 5A.
Figure 6B:
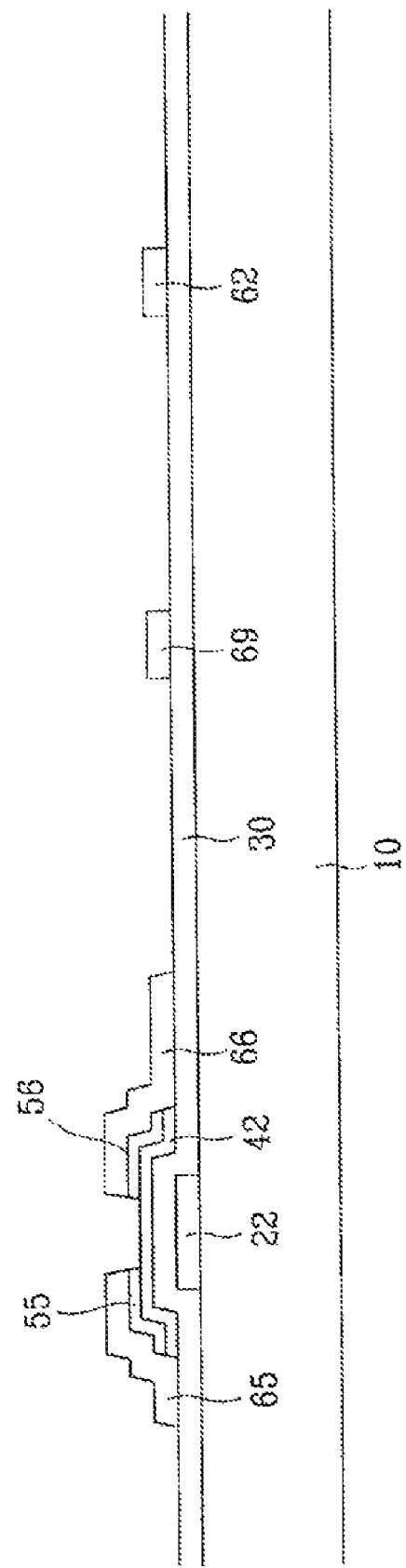
FIGS. 6B and 6C are cross sectional views of the thin film transistor array panel taken long the VIB-VIB' line and the VIC-VIC' line of FIG. 6A.
Figure 6C:
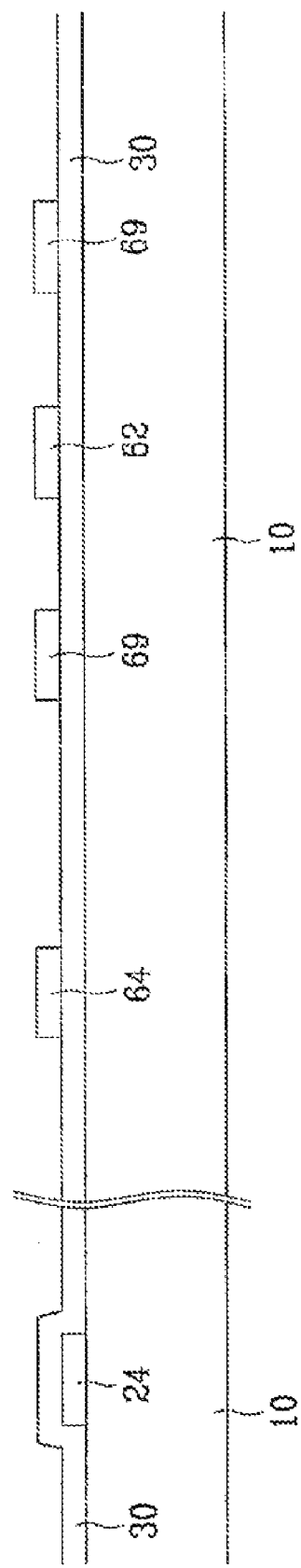

As shown in FIGS. 6A to 6C, a metallic layer is deposited onto the entire surface of the substrate, and patterned through photolithography to thereby form a data line assembly and storage capacitor electrode lines 69. The data line assembly includes data lines 62, data pads 64, source electrodes 65, and drain electrodes 66. The storage capacitor electrode lines 69 are alternately arranged with the data lines 62.

The ohmic contact pattern 52 is etched using the source electrode 55 and the drain electrode 66 as a mask to thereby separate it into a first portion 55 contacting the source electrode 65, and a second portion 56 contacting the drain electrode 66.

Figure 7A:
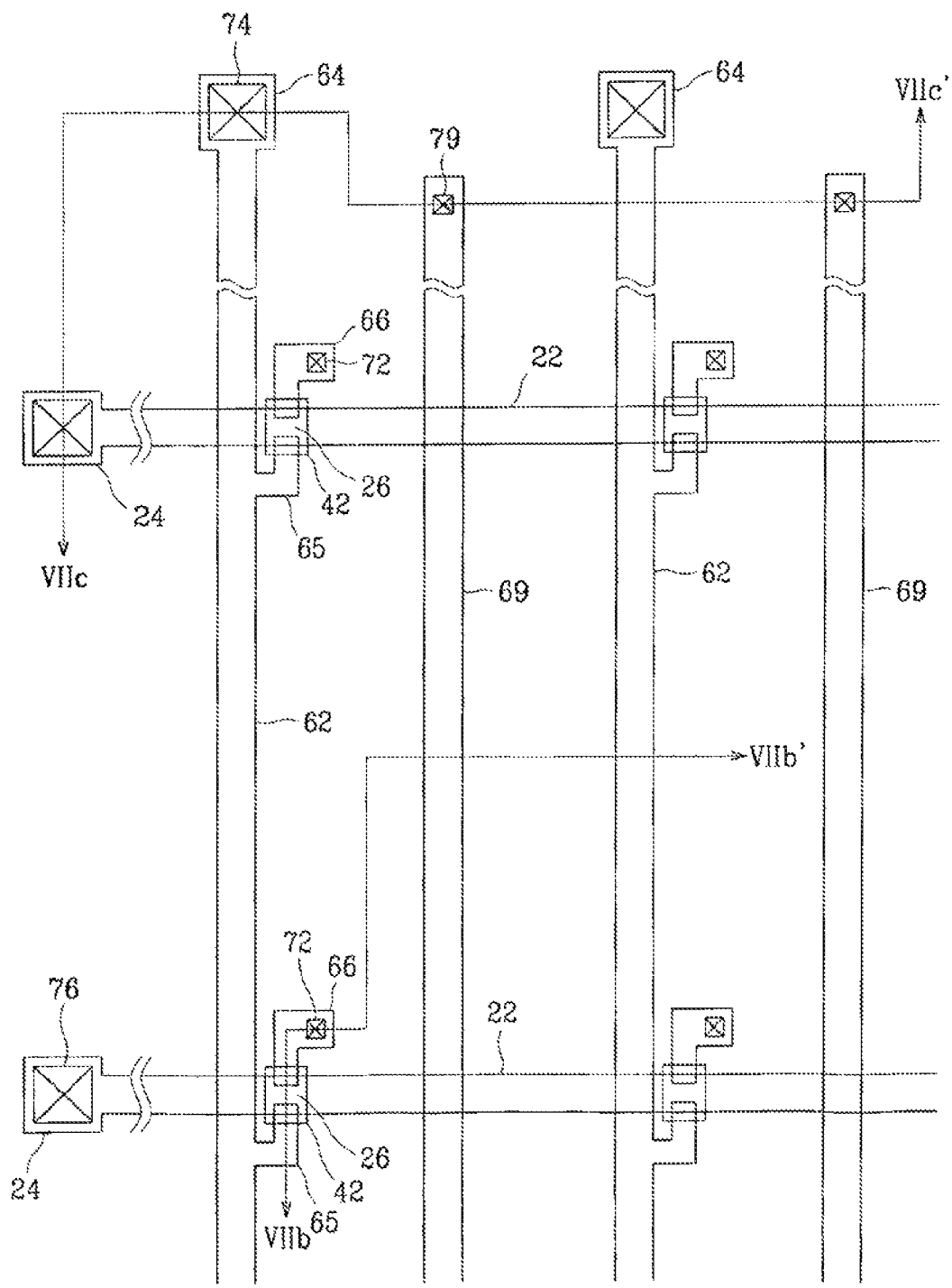
FIG. 7A illustrates the step of fabricating the thin film transistor array panel following the step illustrated in FIG. 6A.
Figure 7C:
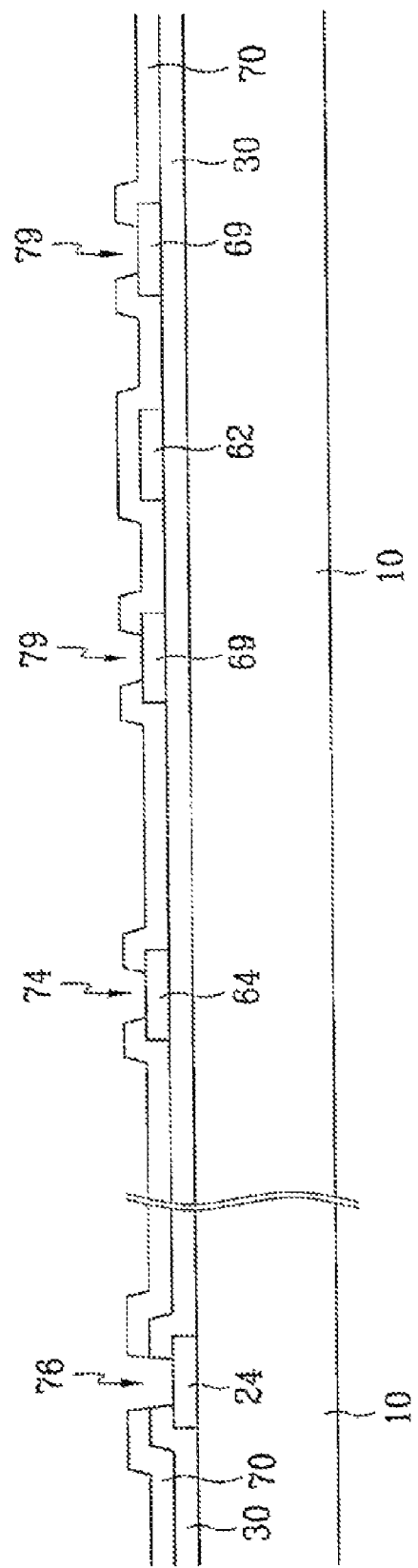

As shown in FIGS. 7A to 7C, a passivation layer 70 covers the data line assembly, the storage capacitor electrode lines 69, and the semiconductor pattern 42. The passivation layer 70 is formed with silicon nitride while bearing a thin thickness. In consideration of the electrostatic capacitance of the storage capacitors to be formed, it is preferable that the thickness of the passivation layer 70 is controlled in an appropriate manner.

The passivation layer 70 and the gate insulating layer 30 are patterned through photolithography to thereby form first to fourth contact holes 72, 74, 76 and 79.

As shown in FIGS. 1 to 3, a transparent conductive layer based on ITO or IZO is deposited onto the entire surface of the substrate 10.

The transparent conductive layer is patterned through photolithography to thereby form pixel electrodes 62, subsidiary data pads 84, subsidiary gate pads 86, and a common interconnection line 88. The pixel electrodes 82 are connected to the drain electrodes 66 through the first contact holes 72. The subsidiary data and gate pads 84 and 86 are connected to the data and gate pads 64 and 24 through the second and the third contact holes 74 and 76. The common interconnection line 88 interconnects all of the storage capacitor electrode lines 69 through the fourth contact holes 79.

The common interconnection line 88 may be formed with the same material as the gate line assembly. For that purpose, the common interconnection line is formed during the process of forming the gate line assembly while being followed by the formation of the gate insulating layer 30. A plurality of contact holes exposing the common interconnection line are then formed at the gate insulating layer 30. The storage capacitor electrode lines 69 are formed during the process of forming the data line assembly. In this process, the storage capacitor electrode lines 69 are connected to the common interconnection line through the contact holes.

As described above, the storage capacitor electrode lines are formed at the same plane as the data lines such that they are overlapped with the pixel electrodes while interposing the passivation layer bearing a thin thickness to thereby form storage capacitors.

Alternatively, the storage capacitors may be formed using a gate insulating layer instead of the passivation layer.

Figure 8:
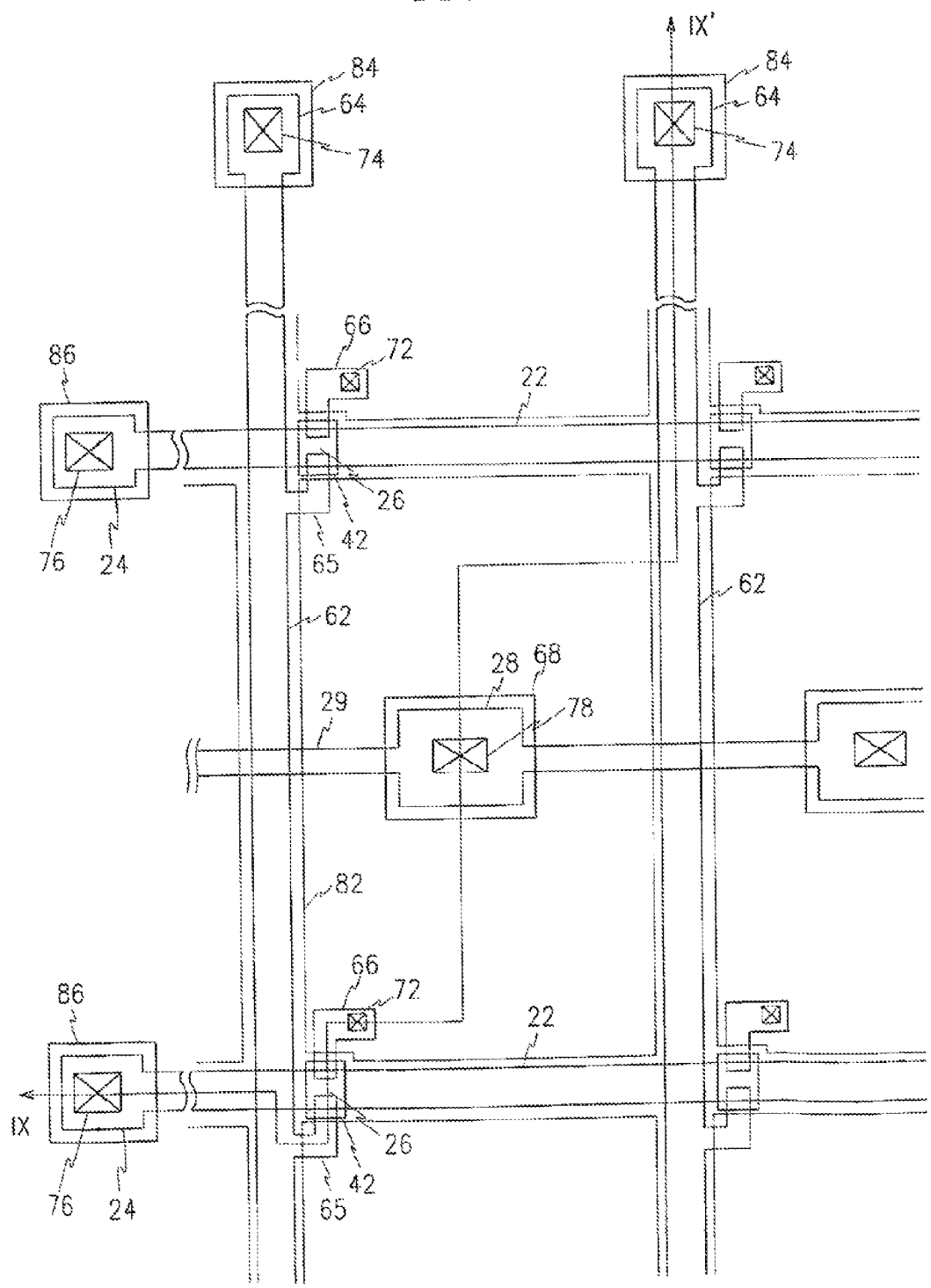
FIG. 8 is a plan view of a thin film transistor array panel according to a second preferred embodiment of the present invention.
Figure 9:
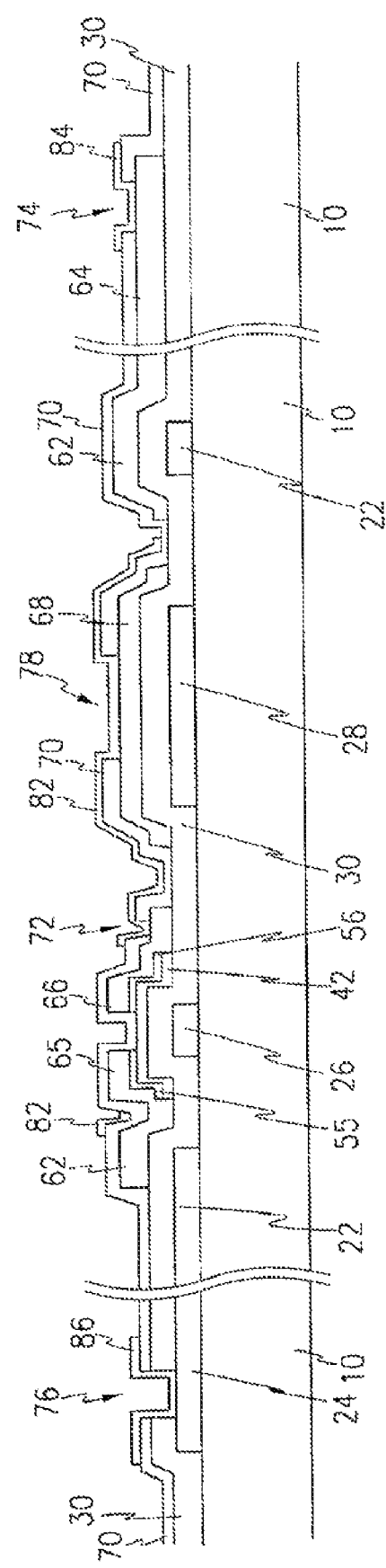
FIG. 9 is a cross sectional view of the thin film transistor array panel taken along the IX-IX' line of FIG. 8.

FIG. 8 is a plan view of a thin film transistor array panel according to a second preferred embodiment of the present invention, and FIG. 9 is a cross sectional view of the thin film transistor array panel taken along the IX-IX' line of FIG. 8.

A gate line assembly and a storage capacitor line assembly are formed on an insulating substrate 10 with a conductive material such as aluminum, aluminum alloy, chrome, chrome alloy, molybdenum, molybdenum alloy, chrome nitride, and molybdenum nitride while bearing a thickness of 1000-3500 Å.

The gate line assembly includes gate lines 22 proceeding in the horizontal direction, gate pads 24 formed at the one-sided end portions of the gate lines 22 while electrically contacting external driving circuits (not shown), and gate electrodes 26 being parts of the gate lines 22 while forming thin film transistors with other components.

The storage capacitor line assembly includes rectangular-shaped storage capacitor electrode patterns 28 disposed between the neighboring gate lines 22, and storage capacitor electrode lines 29 connected to the storage capacitor electrode patterns in the neighboring pixel regions while proceeding in the horizontal direction parallel to the gate lines 22.

The gate line assembly and the storage capacitor line assembly may have a multiple-layered structure where at least one layer is formed with a low resistance metallic material.

A gate insulating layer 30 with a thickness of 2500-4500 Å is formed on the insulating substrate 10 with silicon nitride or silicon oxide while covering the gate line assembly and the storage capacitor line assembly.

A semiconductor pattern 42 with a thickness of 800-1500 Å is formed on the gate insulating layer 30 with amorphous silicon while being overlapped with the gate electrodes 28. Ohmic contact patterns 55 and 56 with a thickness of 500-800 Å are formed on the semiconductor pattern 42 with amorphous silicon where n type impurities are doped at high concentration.

A data line assembly and storage capacitor conductive patterns 68 are formed on the ohmic contact patterns 55 and 56 and the gate insulating layer 30 with a conductive material such as aluminum, aluminum alloy, chrome, chrome alloy, molybdenum, molybdenum alloy, chrome nitride and molybdenum nitride while bearing a thickness of 500-3500 Å.

The data line assembly includes data lines 62 proceeding in the vertical direction while crossing over the gate lines 22 to define pixel regions, data pads 64 formed at the one-sided end portions of the data lines 62 while electrically contacting external driving circuits, source electrodes 65 connected to the data lines 62 while being extended over the ohmic contact pattern 55, and drain electrodes 66 facing the source electrodes 65 while being placed over the other ohmic contact pattern 56. The drain electrodes 66 are extended over the gate insulating layer 30 within the pixel regions.

The storage capacity conductive patterns 68 are placed at the same plane as the data line assembly while bearing an island shape such that they are overlapped with the storage capacitor electrode patterns 28 while interposing the gate insulating layer 30 to thereby form storage capacitors. The storage capacitor conductive patterns 68 are electrically connected to pixel electrodes 82 to be described later to receive picture signal voltages.

The data line assembly and the storage capacitor conductive patterns 68 may have a multiple-layered structure where at least one layer is formed with a low resistance metallic material.

A passivation layer 70 covers the data line assembly, the storage capacitor conductive patterns 68 and the semiconductor pattern 42 while bearing a thickness of 500-2000 Å. The passivation layer 70 is formed with an insulating material such as silicon nitride and silicon oxide.

First and second contact holes 72 and 74 are formed at the passivation layer 70 while exposing the drain electrodes 66 and the data pads 64. Third contact holes 76 are formed at the passivation layer 70 while composing the gate pads 24 together with the gage insulating layer 30. Furthermore, fourth contact holes 78 are formed at the passivation layer 70 while exposing the storage capacitor conductive patterns 68.

Pixel electrodes 82 are formed on the passivation layer 70 such that they are electrically connected to the drain electrodes 66 and the storage capacitor conductive patterns 68 through the first and the fourth contact holes 72 and 78.

Subsidiary data pads 84 and subsidiary gate pads 86 are formed on the passivation layer 70 while being connected to the data pads 64 and the gate pads 24 through the second and the third contact holes 74 and 76.

The pixel electrodes 82, the subsidiary data pads 84 and the subsidiary gate pads 80 are formed with a transparent conductive material such as ITO and IZO.

The pixel electrodes 82 are overlapped with the storage capacitor line assembly while interposing the passivation layer 70 and the gate insulating layer 30 to thereby form storage capacitors.

The pixel electrodes 82 are connected to the storage capacitor conductive patterns 68. In this way, the storage capacitor conductive patterns 68 from other storage capacitors in association with the storage capacitor electrode patterns 28 while interposing the gate insulating layer 30. In this case, as the thickness of the gate insulating layer 30 disposed between the storage capacitor conductive patterns 68 and the storage capacitor electrode patterns 28 is small, the electrostatic capacitance of the resulting storage capacitors becomes increased even with the same overlapping area compared to the overlapping of the storage capacitor electrode patterns 28 and the pixel electrodes 82. Consequently, the aperture ratio with respect to the storage capacity becomes enhanced.

A method of fabricating the thin film transistor array panel will be now explained with reference to FIGS. 10A to 13B as well as FIGS. 8 and 9.

Figure 10A:
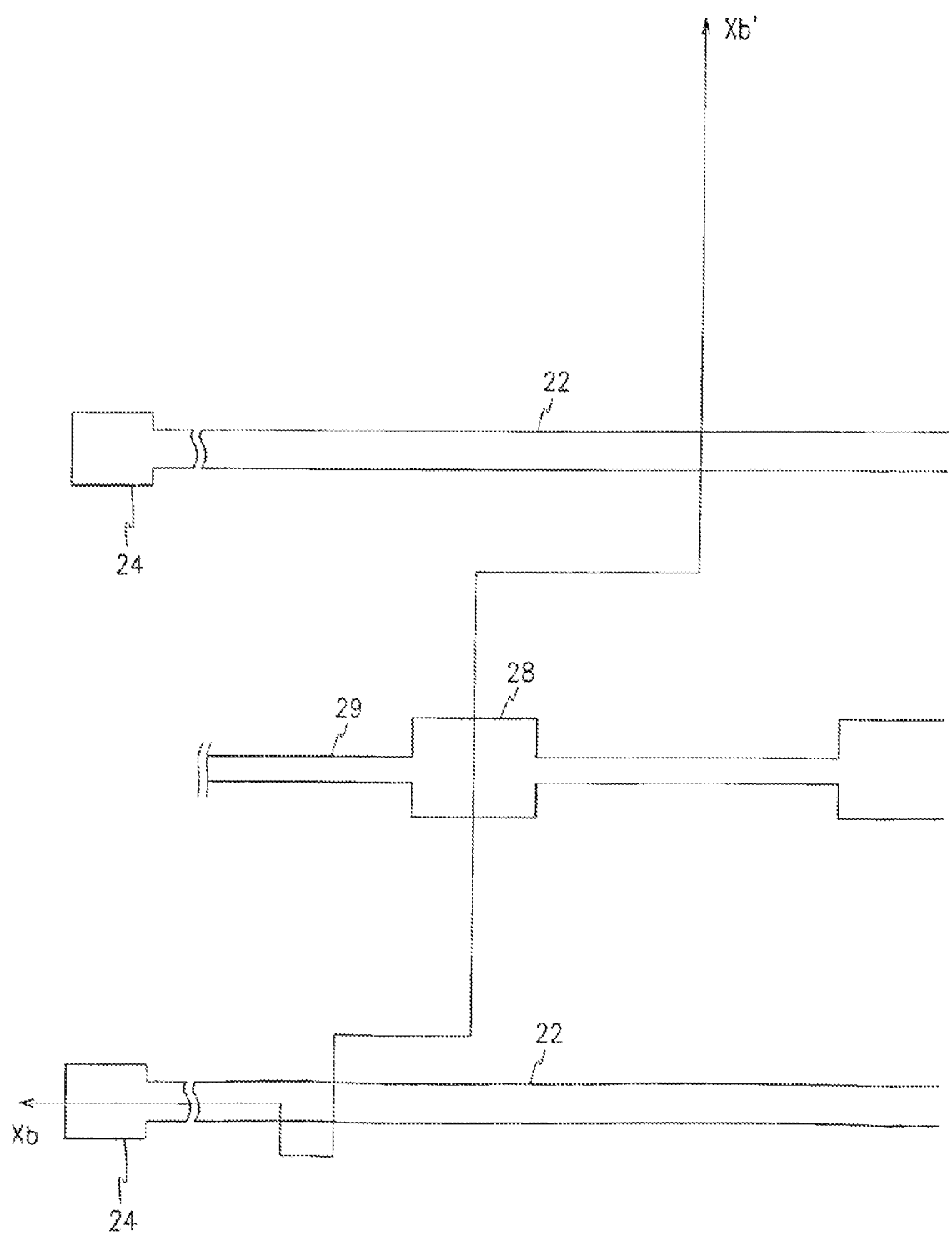
FIG. 10A illustrates the first step of fabricating the thin film transistor array panel shown in FIG. 8.
Figure 10B:
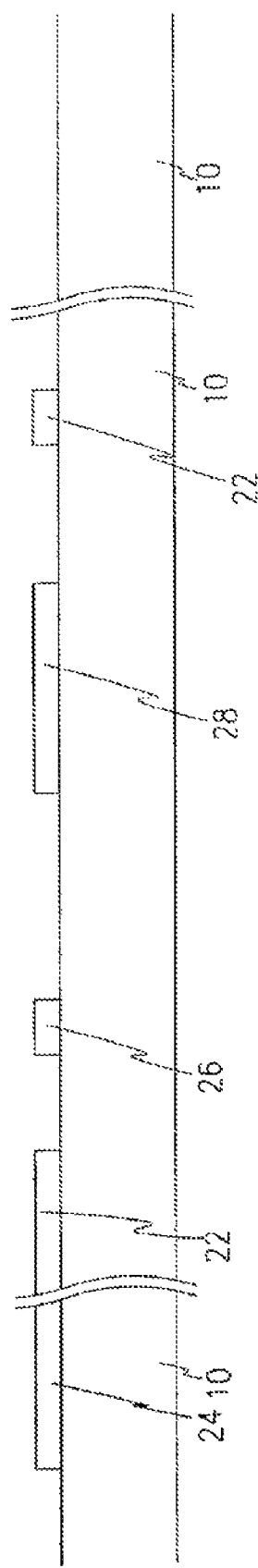
FIG. 10B is a cross sectional view of the thin film transistor array panel taken long the XBb-XB' line of FIG. 10A.

As shown in FIGS. 10A and 10B, a metallic layer is deposited onto an insulating substrate 10, and patterned through photolithography to thereby form a gate line assembly and a storage capacitor line assembly. The gate line assembly includes gate lines 22, gate pads 24, and gate electrodes 28. The storage capacitor line assembly includes storage capacitor electrode patterns 28, and storage capacitor electrode lines 29.

Figure 11A:
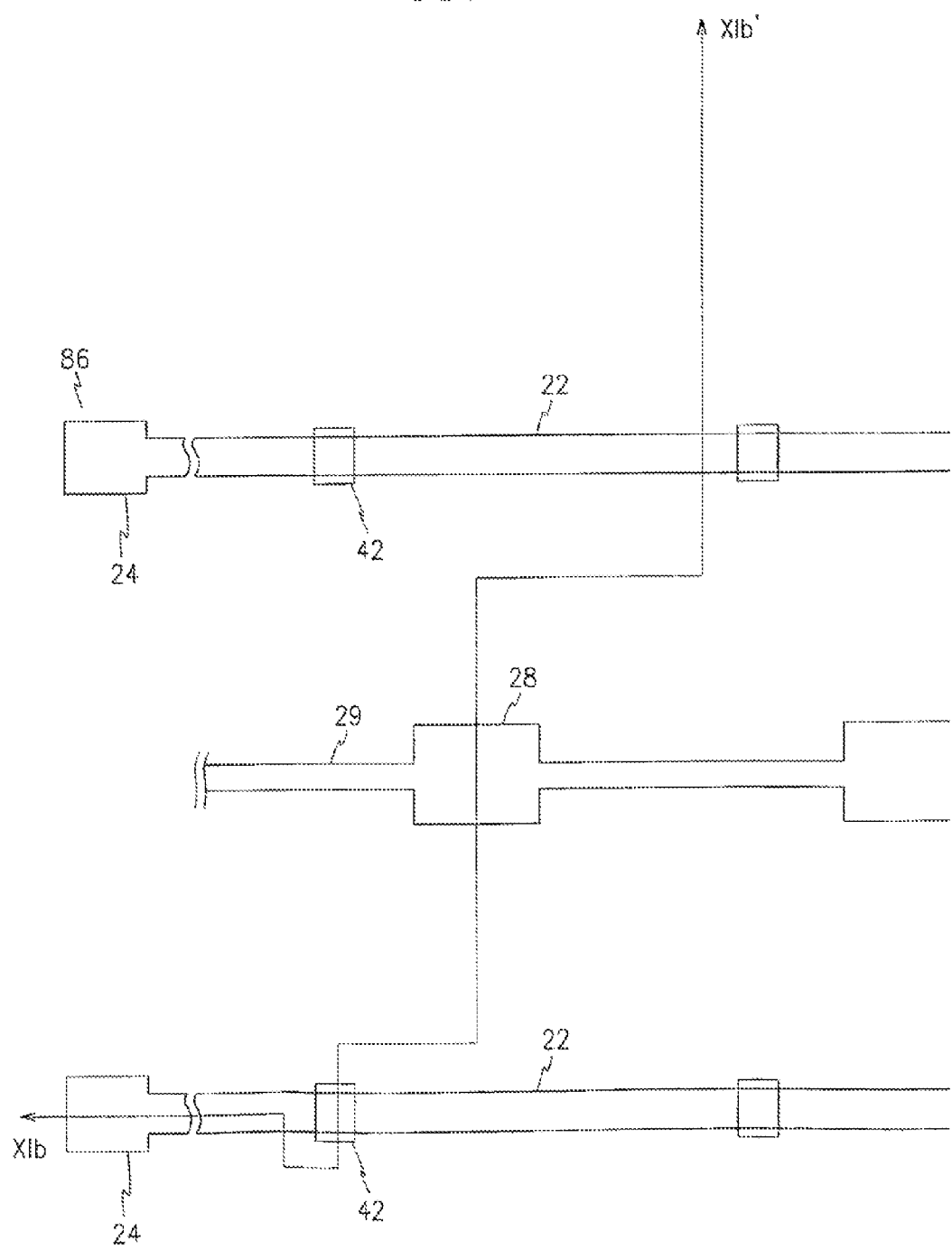
FIG. 11A illustrates the step of fabricating the thin film transistor array panel following the step illustrated in FIG. 10A.
Figure 11B:
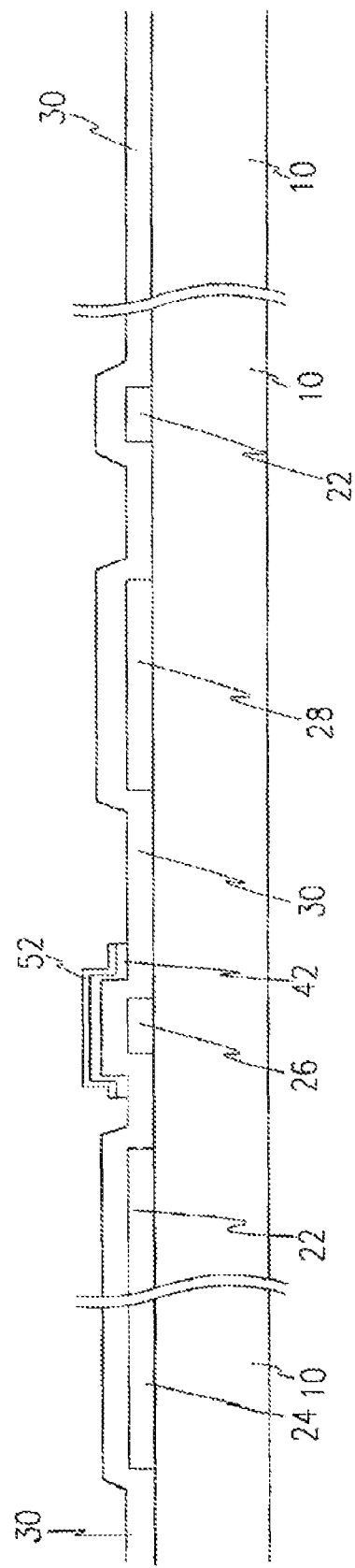
FIG. 11B is a cross sectioned view of the thin film transistor array panel taken long the XIB-XIB' line of FIG. 11A.

Thereafter, as shown in FIGS. 11A and 11B, a gate insulating layer 30 based on an insulating material such as silicon nitride is deposited onto the insulating substrate 10 such that it covers the gate line assembly and the storage capacitor line assembly.

An amorphous silicon layer and a conductive type impurities-doped amorphous silicon layer are sequentially deposited onto the gate insulating layer 30, and patterned through photolithography to thereby form a semiconductor pattern 42 and an ohmic contact pattern 52.

Figure 12A:
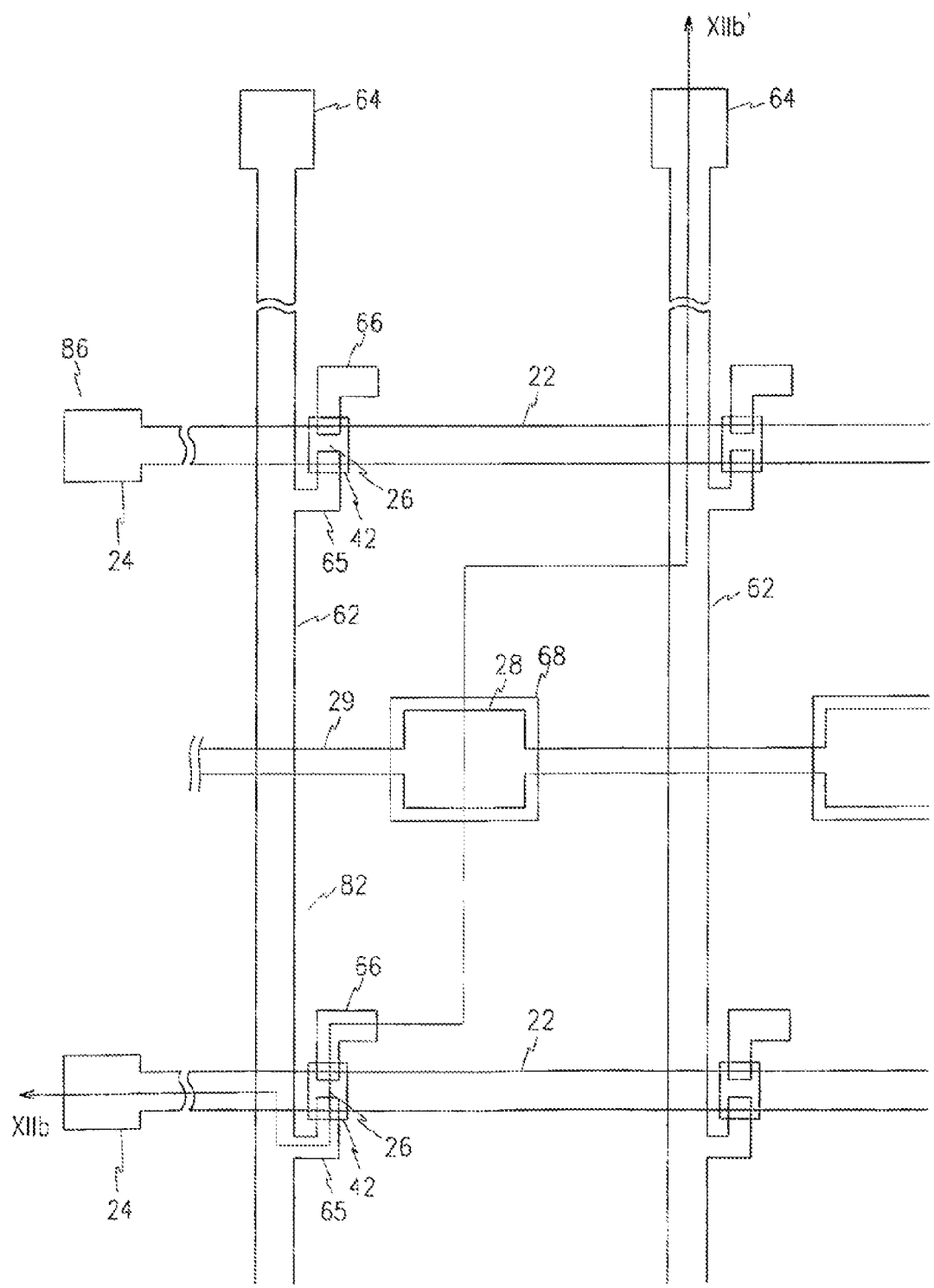
FIG. 12A illustrates the step of fabricating the thin film transistor array panel following the step illustrated in FIG. 11A.
Figure 12B:
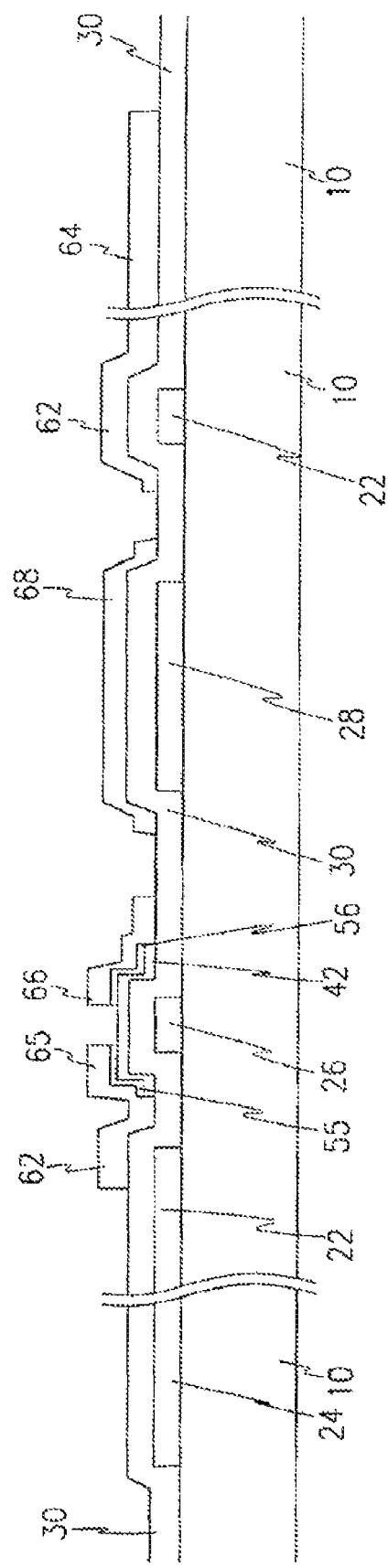
FIG. 12B is a cross sectional view of the thin film transistor array panel taken long the XIIB-XIIB' line of FIG. 12A.

As shown in FIGS. 12A and 12B, a metallic layer is deposited onto the entire surface of the substrate 10, and patterned through photolithography to thereby form a data line assembly, and storage capacitor conductive patterns 68. The data line assembly includes data lines 62, data pads 64, source electrodes 65, and drain electrodes 66. The storage capacitor conductive patterns 68 are overlapped with the storage capacitor electrode patterns 28.

The ohmic contact pattern 52 is etched using the source electrode 65 and the drain electrode 66 as a mask to thereby separate it onto a first portion 55 contacting the source electrode 65, and a second portion 56 contacting the drain electrode 66.

Figure 13A:
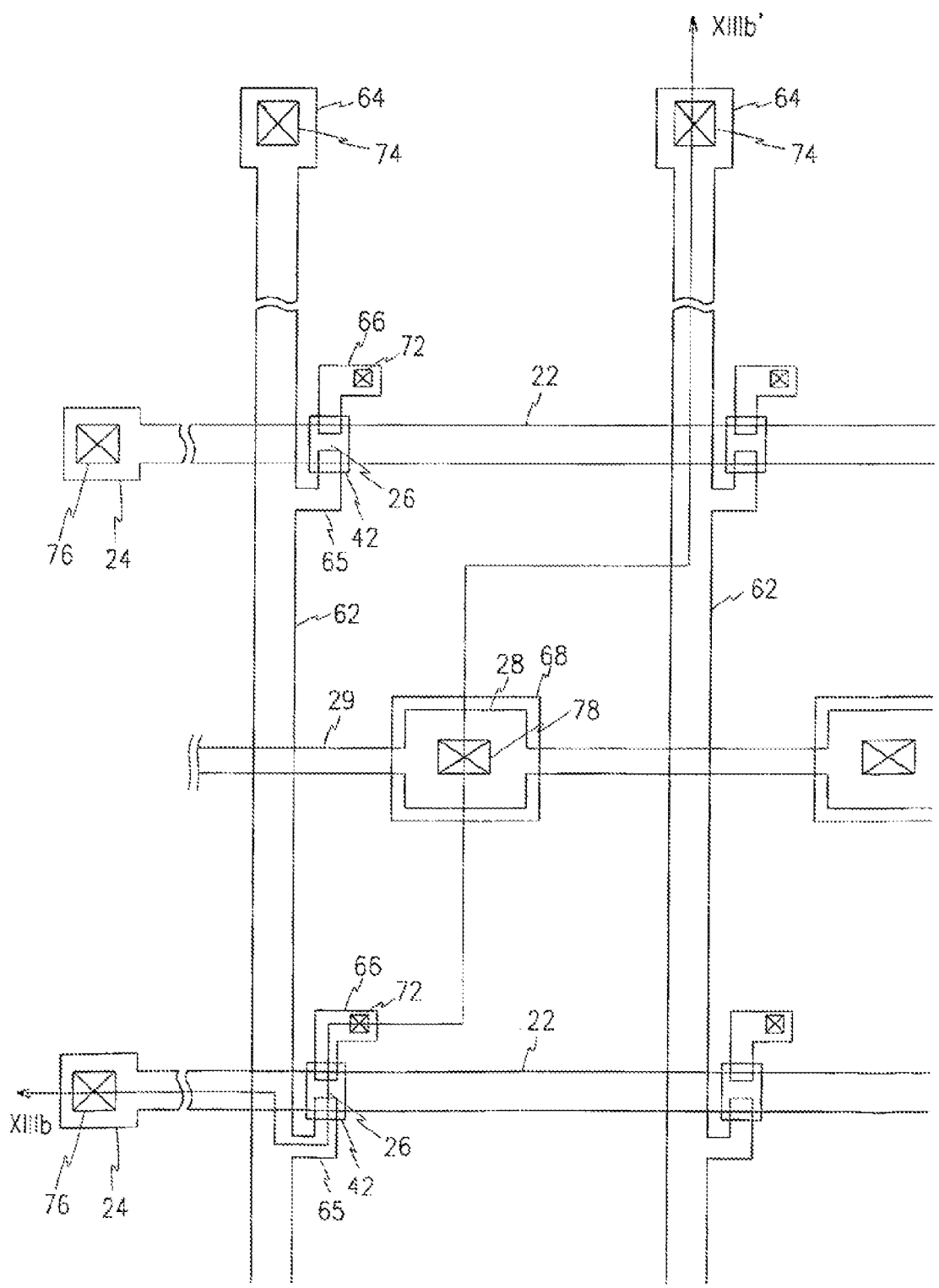
FIG. 13A illustrates the step of fabricating the thin film transistor array panel following the step illustrated in FIG. 12A.
Figure 13B:
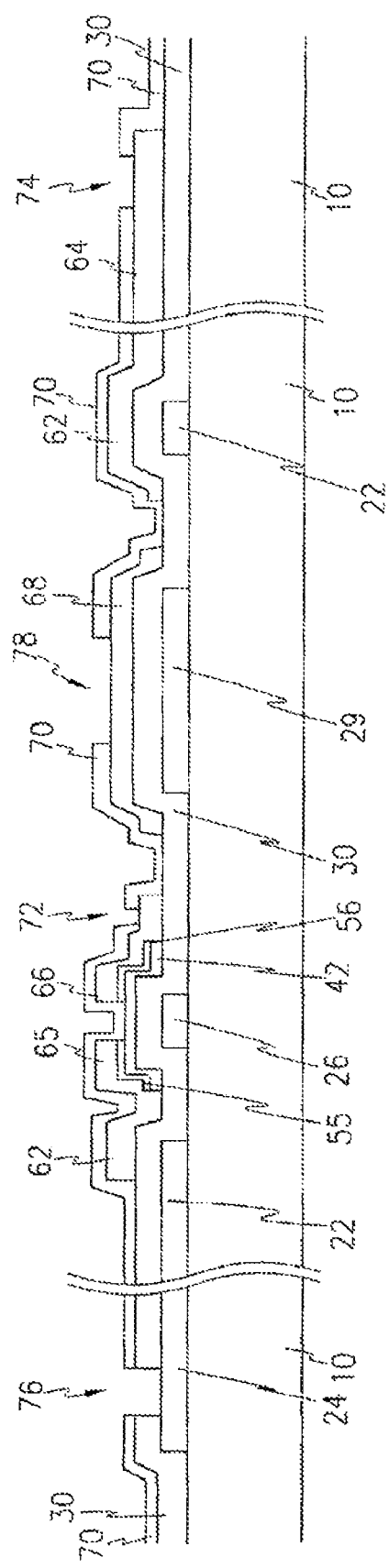
FIG. 13B is a cross sectional view of the thin film transistor array panel taken long the XIIIB-XIIIB' line of FIG. 13A.

As shown in FIGS. 13A and 13B, a passivation layer 70 is formed on the entire surface of the substrate 10 having the data line assembly, the storage capacitor conductive patterns 68 and the semiconductor pattern 42 with silicon nitride or silicon oxide. The passivation layer 70 and the gate insulating layer 30 are patterned through photolithography to thereby form first to fourth contact holes 72, 74, 76 and 78. The first contact holes 72, the second contact holes 74 and the fourth contact holes 78 are formed at the passivation layer 70 while exposing the drain electrodes 66, the data pads 64 and the storage capacitor conductive patterns 68, respectively. Furthermore, the third contact holes 76 are formed at the passivation layer 70 and the gate insulating layer 30 while exposing the gate pads 24.

As shown in FIGS. 8 and 9, a transparent conductive layer based on ITO or IZO is deposited onto the entire surface of the substrate 10.

The transparent conductive layer is patterned through photolithography to thereby form pixel electrodes 82, subsidiary data pads 84, and subsidiary gate pads 86. The pixel electrodes 82 are connected to the drain electrodes 66 and the storage capacitor conductive patterns 68 through the first and the fourth contact holes 72 and 78. The subsidiary data and gate pads 84 and 86 are connected to the data and gate pads 64 and 24 through the second and the third contact holes 74 and 76.

In this preferred embodiment, the storage capacitor conductive patterns 68 are placed at the pixel regions between the neighboring gate lines while bearing an island shape. Alternatively, the storage capacitor conductive patterns 68 may be formed at the periphery of the pixel regions while bearing a bar shape. In this case, the storage capacitor electrode patterns 28 for forming storage capacitors in association with the storage capacitor conductive patterns 68 are also formed with a bar shape.

Figure 14:
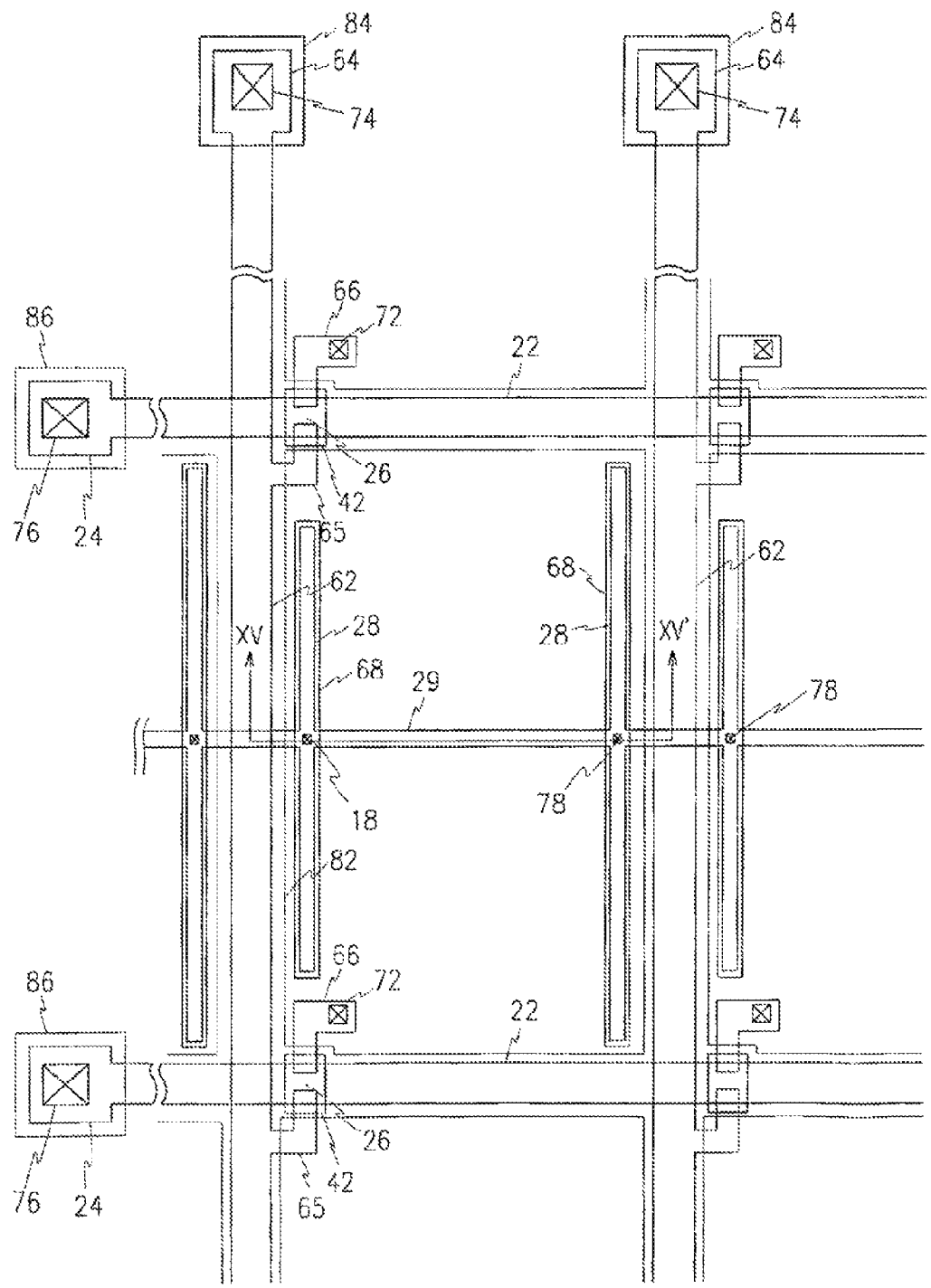
FIG. 14 is a plan view of a thin film transistor array panel according to a third preferred embodiment of the present invention.
Figure 15:
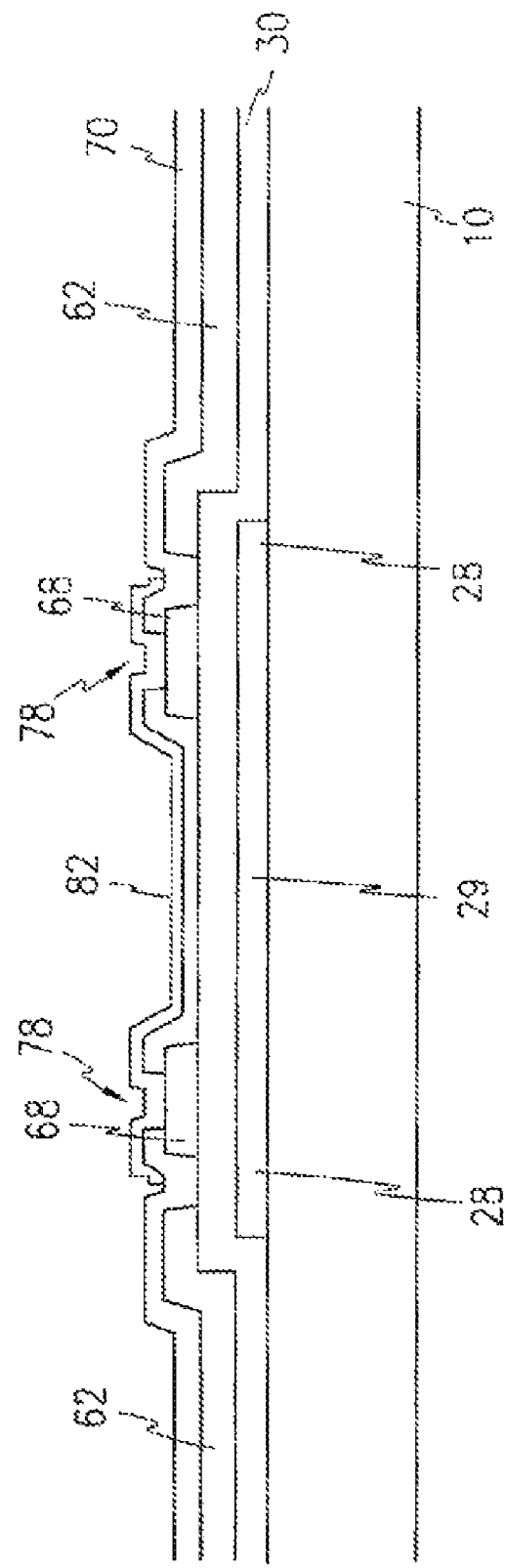
FIG. 15 is a cross sectional view of the thin film transistor array panel taken along the XV-XV line of FIG. 14.

FIG. 14 is a plan view of a thin film transistor array panel according to a third preferred embodiment of the present invention, and FIG. 15 is a cross sectional view of the thin film transistor array panel taken along the XV-XV' line of FIG. 14.

In this preferred embodiment, the storage capacitor electrode patterns 28 are placed at both peripheral sides of the pixel regions while bearing a bar shape. Of course, the respective storage capacitor electrode patterns 28 are connected to the storage capacitor electrode lines 29.

The storage capacitor conductive patterns 68 for forming storage capacitors in association with the storage capacitor electrode patterns 28 are overlapped with the storage capacitor electrode patterns 28 while interposing the gate insulating layer 30.

The fourth contact holes 78 through which the storage capacitor conductive patterns 68 are connected to the pixel electrodes 82 are established to partially expose the storage capacitor conductive patterns 68.

In this structure, the storage capacitor electrode lines 29 from storage capacitors in association with the pixel electrodes 82 while interposing the gate insulating layer 30 and the passivation layer 70. Furthermore, the storage capacitor electrode patterns 28 form storage capacitors in association with the storage capacitor conductive patterns 68 while interposing the gate insulating layer 30.

With such a structure, the electrostatic capacitance of the resulting storage capacitors becomes increased even with the same overlapping area compared to the case where the storage capacitor electrode patterns 28 are overlapped with only the pixel electrodes 82. Consequently, the aperture ratio with respect to the storage capacity becomes enhanced.

Furthermore, as the bar-shaped storage capacitor electrode patterns 28 or storage capacitor conductive patterns 68 are placed between the pixel electrodes 82 and the data lines 62, leakage of light between the pixel electrodes 82 and the data lines 62 can be prevented.

In the second and third preferred embodiments of the present invention, the storage capacitor line assembly is formed in a separate manner. Alternatively, parts of the gate lines may be utilized as the storage capacitor electrodes.

Figure 16:
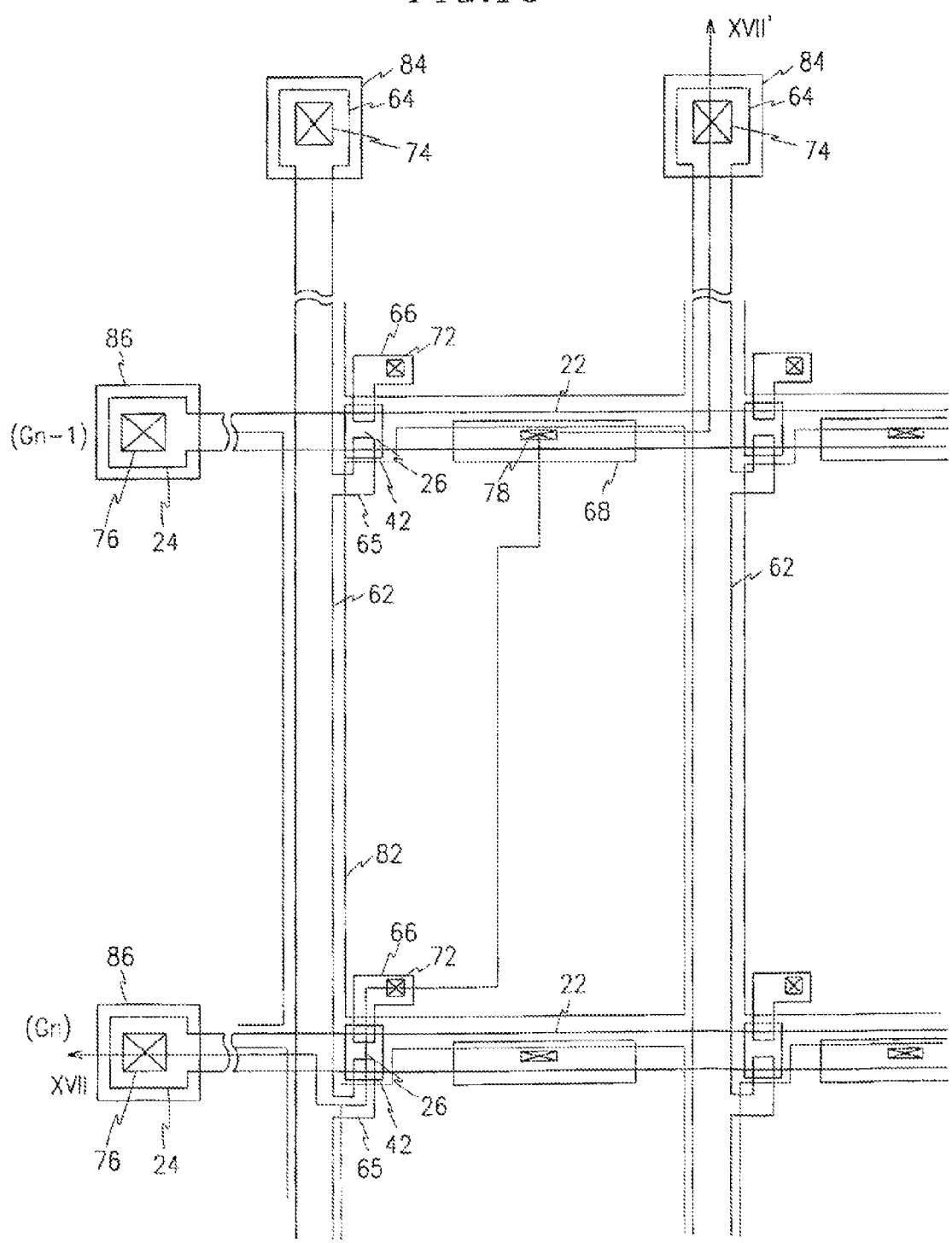
FIG. 16 is a plan view of a thin film transistor array panel according to a fourth preferred embodiment of the present invention.
Figure 17:
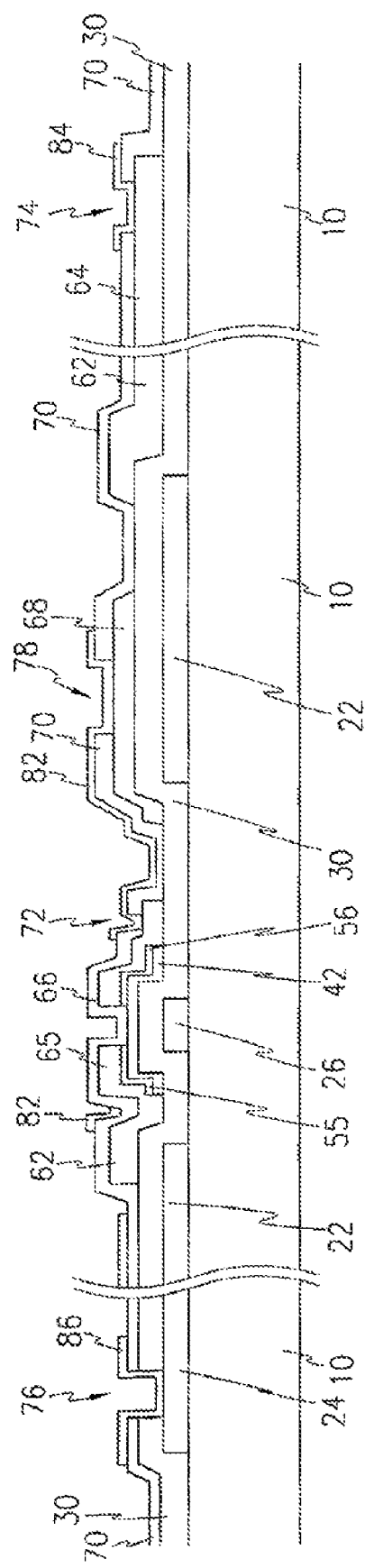
FIG. 17 is a cross sectional view of the thin film transistor array panel taken long the XVII-XVII line of FIG. 16.

FIG. 16 is a plan view of a thin film transistor array panel according to a fourth preferred embodiment of the present invention, and FIG. 17 is a cross sectional view of the thin film transistor array panel taken along the XVII-XVII' line of FIG. 16.

In this preferred embodiment, the pixel electrodes arranged at any one gate line are overlapped with parts of the previous gate line to form storage capacitors. That is, parts of the gate lines are used to form the desired storage capacitors without forming a storage capacitor line assembly in a separate manner.

As shown in FIG. 16, the pixel electrodes 82 at the nth gate line 22 (Gn) are overlapped with the (n−1)th gate line 22 (Gn−1) while being extended in its area.

The storage capacitor conductive patterns 68 are partially overlapped with the gate lines 22 while interposing the gate insulating layer 30. The storage capacitor conductive patterns 68 are placed at the same plane as the data line assembly. The fourth contact holes 78 exposing the storage capacitor conductive patterns 68 are formed at the passivation layer 70, and the pixel electrodes 82 at any one gate line 22 are connected to the storage capacitor conductive patterns 68 placed over the previous gate line 22 through the fourth contact holes 78.

The storage capacitor conductive patters 68 are overlapped with the gate lines 22 while interposing the gate insulating layer 30 to thereby form storage capacitors. The storage capacitor conductive patters 68 placed over the (n−1) gate line 22 (Gn−1) receive the relevant signals from the pixel electrodes 82 at the nth gate line 22 (Gn).

In the above structure, the storage capacity becomes significantly increased compared to the case where the storage capacitors are formed only through overlapping the pixel electrodes 82 with the gate lines 22. Furthermore, as a separate storage capacitor line assembly is not needed, the aperture ratio can be further enhanced.

Figure 18:
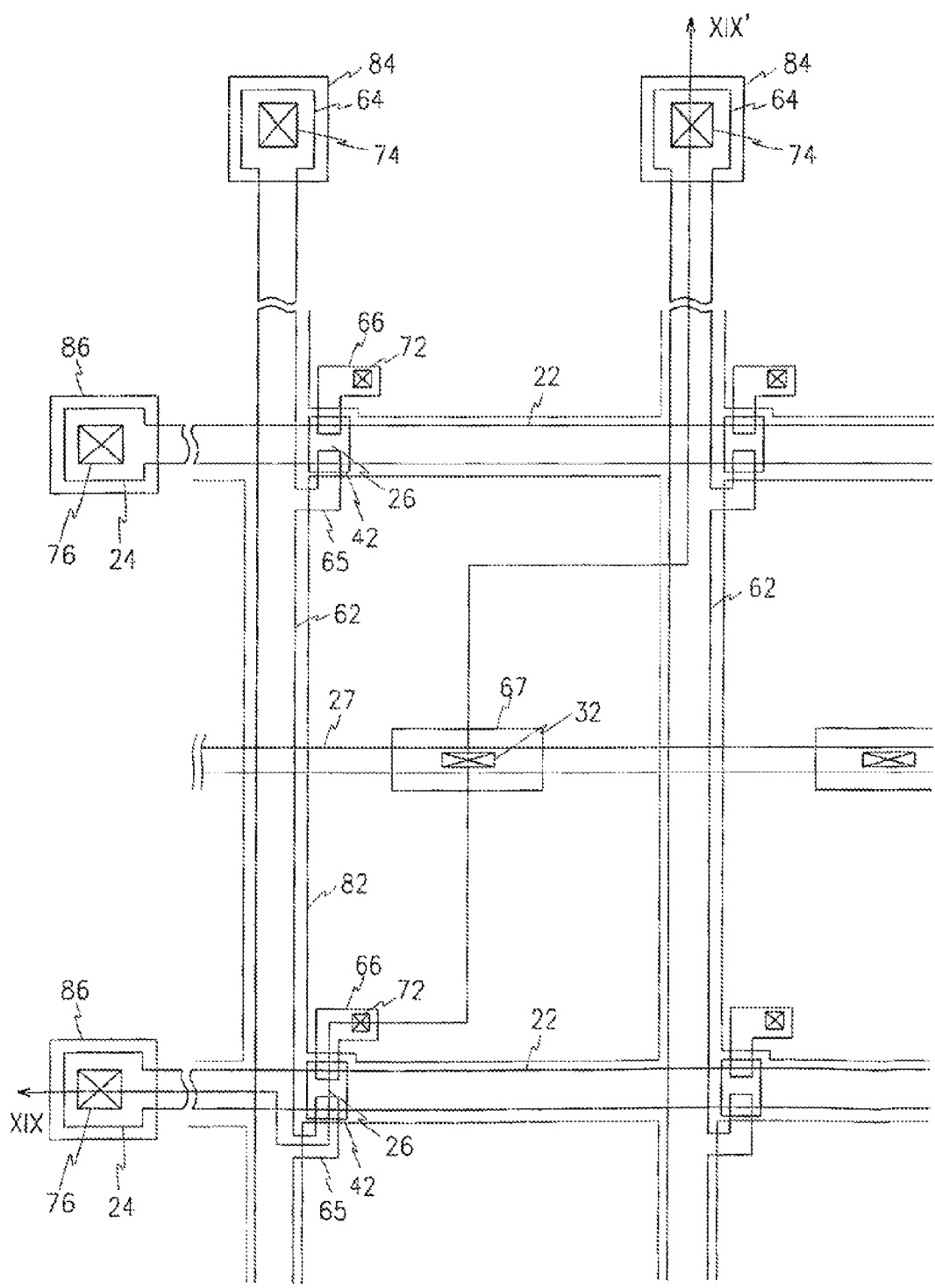
FIG. 18 is a plan view of a thin film transistor array panel according to a fifth preferred embodiment of the present invention.
Figure 19:
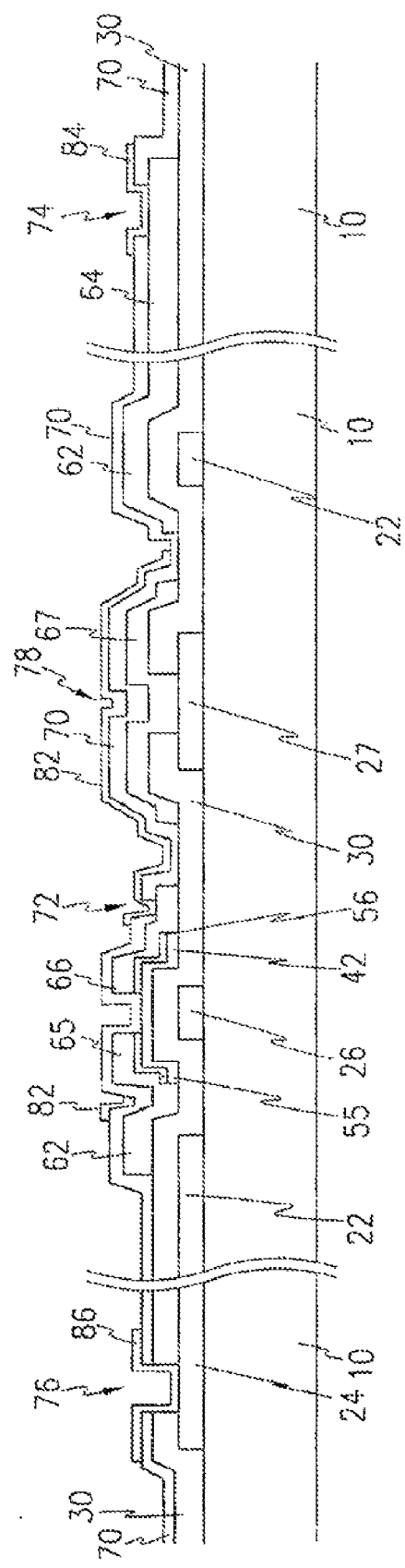
FIG. 19 is a cross sectional view of the thin film transistor array panel taken long the XIX-XIX' line of FIG. 18.

FIG. 18 is a plan view of a thin film transistor array panel according to a fifth preferred embodiment of the present invention, and FIG. 19 is a cross sectional view of the thin film transistor array panel taken along the XIX-XIX' line of FIG. 18.

A gate line assembly and storage capacitor electrode lines 27 are formed on an insulating substrate 10 with a conductive material such as aluminum, aluminum alloy, chrome, chrome alloy, molybdenum, molybdenum alloy, chrome nitride, and molybdenum nitride while bearing a thickness of 1000-3500 Å.

The gate line assembly includes gate lines 22 proceeding in the horizontal direction, gate pads 24 formed at the one-sided end portions of the gate lines 22 while electrically contacting external driving circuits (not shown), and gate electrodes 26 being parts of the gate lines 22 while forming thin film, transistors with other electrode components.

The storage capacitor electrode lines 27 are placed between the neighboring gate liens 22 while proceeding in the horizontal direction parallel to the gate lines 22.

The gate line assembly and the storage capacitor electrode lines 27 may have a multiple layered structure where at least one layer is formed with a low resistance metallic material.

A gate insulating layer 30 with a thickness of 2500-4500 Å is formed on the insulating substrate 10 with silicon nitride or silicon oxide while covering the gate line assembly and the storage capacitor electrode lines 27.

First contact holes 32 are formed at the gate insulating layer 30 while exposing the storage capacitor electrode lines 27.

A semiconductor pattern 42 with a thickness of 800-1500 Å is formed on the gate insulating layer 30 with amorphous silicon while being overlapped with the gate electrodes 26. Ohmic contact patterns 55 and 56 with a thickness of 500-800 Å are formed on the semiconductor pattern 42 with amorphous silicon where n type impurities are doped at high concentration.

A data line assembly and storage capacitor conductive patterns 67 are formed on the ohmic contact patterns 55 and 56 and the gate insulating layer 30 with a conductive material such as aluminum, aluminum alloy, chrome, chrome alloy, molybdenum, molybdenum alloy, chrome nitride and molybdenum nitride while bearing a thickness of 500-3500 Å.

The data line assembly includes data lines 62 proceeding in the vertical direction while crossing over the gate lines 22 to define pixel regions, data pads 64 connected to the one-sided ends of the data lines 62 while electrically contacting external driving circuits, source electrodes 65 protruded from the data lines 62 while being extended over the ohmic contact pattern 55, and drain electrodes 66 facing the source electrodes 65 while being placed over the other ohmic contact pattern 56. The drain electrodes 66 are extended over the gate insulating layer 30 within the pixel regions.

The storage capacity conductive patterns 67 are placed at the same plane as the data line assembly while being connected to the storage capacitor electrode lines 27 through the first contact holes 32. The storage conductive patterns 67 are overlapped with pixel electrodes 82 to be described later to thereby form storage capacitors. The storage capacitor conductive patterns 67 are connected to the storage capacitor electrode lines 27 to receive common voltages.

The data line assembly and the storage capacitor conductive patterns 67 may have a multiple-layered structure where at least one layer is formed with a low resistance metallic material.

A passivation layer 70 covers the data line assembly, the storage capacitor conductive patterns 67 and the semiconductor pattern 42 while bearing a thickness of 500-2000 Å. The passivation layer 70 is formed with an insulating material such as silicon nitride and silicon oxide.

Second and third contact holes 72 and 74 are formed at the passivation layer 70 while exposing the drain electrodes 66, and the data pads 64. Fourth contact holes 76 are further formed at the passivation layer 70 while exposing the gate pads 24 together with the gate insulating layer 30.

Pixel electrodes 82 are formed on the passivation layer to such that they are electrically connected to the drain electrodes 66 through the second contact holes 72.

Subsidiary data pads 84 and subsidiary gate pads 86 are formed on the passivation layer 70 while being connected to the data pads 64 and the gate pads 24 through the third and the fourth contact holes 74 and 76.

The pixel electrodes 82, the subsidiary data pads 84 and the subsidiary gate pads 86 are formed with a transparent conductive material such as ITO and IZO.

The pixel electrodes 82 are overlapped with the storage capacitor electrode lines 27 while interposing the passivation layer 70 and the gate insulating layer 30 to thereby form storage capacitors.

The pixel electrodes 82 are also overlapped with the storage capacitor conductive patterns 67 connected to the storage capacitor electrode lines 27 while interposing the passivation layer 70 to thereby form other storage capacitors. In this case, as the thickness of the passivation layer 70 disposed between the pixel electrodes 82 and the storage capacitor conductive patterns 67 is small, the electrostatic capacitance of the resulting storage capacitors becomes increased even with the same overlapping area compared to the overlapping of the storage capacitor electrode lines 27 and the pixel electrodes 62. Consequently, the aperture ratio with respect to the storage capacity becomes enhanced.

A method of fabricating the thin film transistor array panel will be now explained with reference to FIGS. 20A to 24B as well as FIGS. 18 and 19.

Figure 20A:
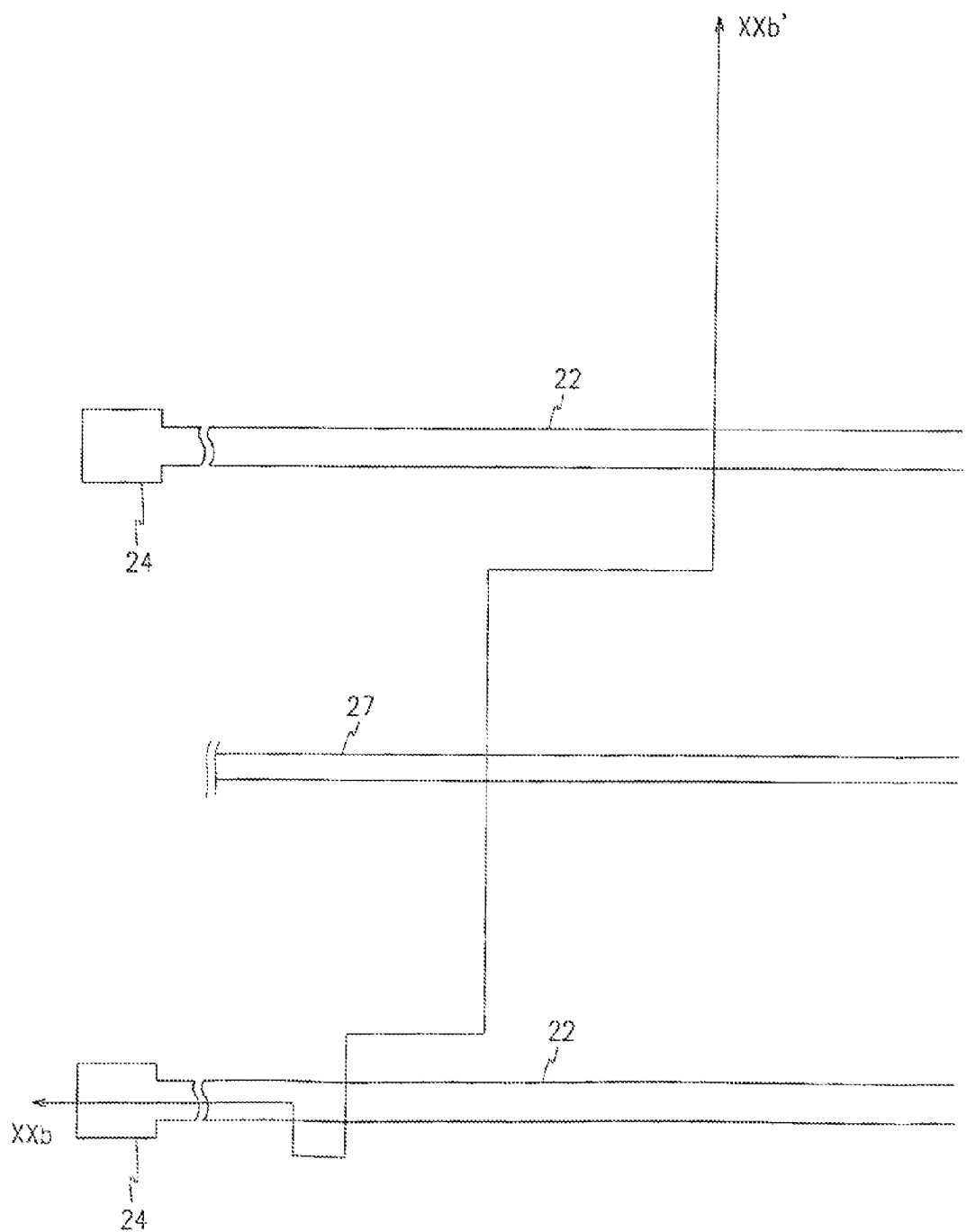
FIG. 20A illustrates the first step of fabricating the thin film transistor array panel shown in FIG. 18.

As shown in FIGS. 20A and 20B, a metallic layer is deposited onto an insulating substrate 10, and patterned through photolithography to thereby form a gate line assembly and storage capacitor electrode lines 27. The gate line assembly includes gate lines 22, gate pads 24, and gate electrodes 26.

Figure 21A:
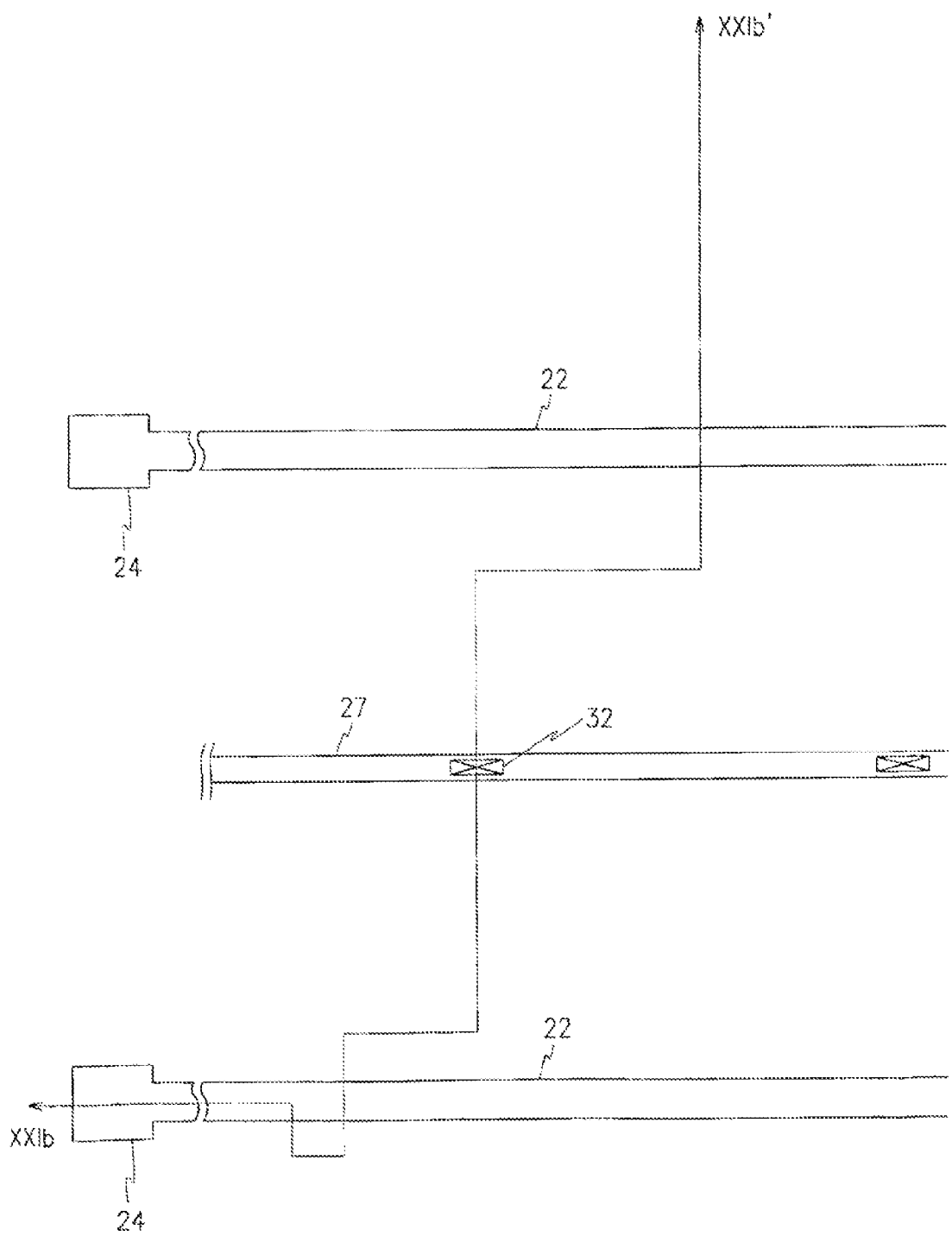
FIG. 21A illustrates the step of fabricating the thin film transistor array panel following the step illustrated in FIG. 20A.
Figure 21B:
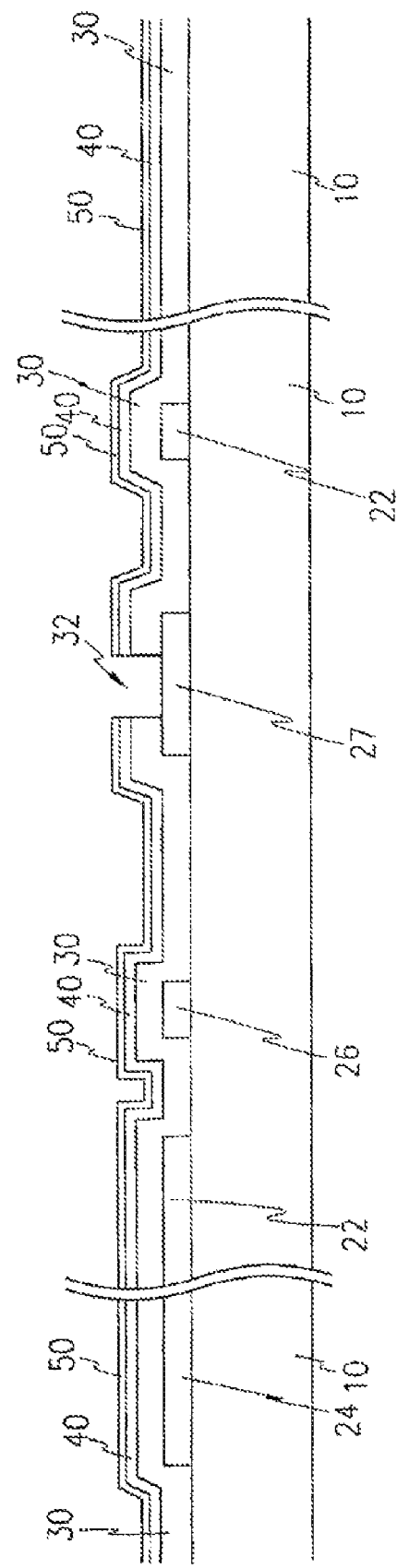
FIG. 21B is a cross sectional view of the thin film transistor array panel taken long the XXIB-XXIB' line of FIG. 21A.

Thereafter, as shown in FIGS. 21A and 21B, a gate insulating layer 30 based on an insulating material such as silicon nitride is deposited onto the insulating substrate 10 such that it covers the gate line assembly and the storage capacitor electrode lines 27. Subsequently, an amorphous silicon layer 40 and a conductive type impurities-doped amorphous silicon layer 50 are sequentially deposited onto the gate insulating layer 30.

Thereafter, the amorphous silicon layer 40, the impurities-doped amorphous silicon layer 50 and the gate insulating layer 30 are patterned through photolithography to thereby form first contact holes 32 exposing the storage capacitor electrode lines 27.

Figure 22A:
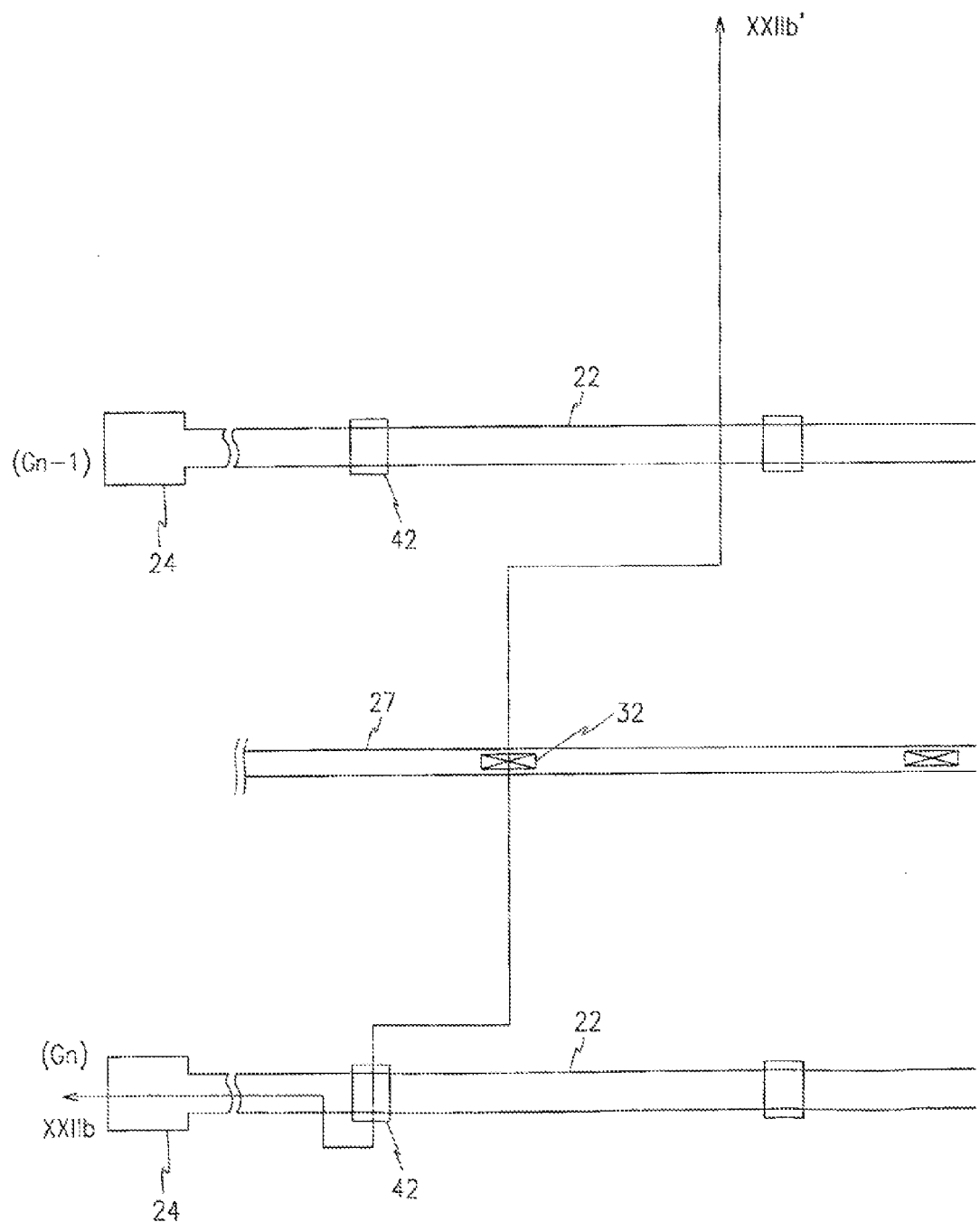
FIG. 22A illustrates the step of fabricating the thin film transistor array panel following the step illustrated in FIG. 21A.

As shown in FIGS. 22A and 22B, the amorphous silicon layer 40 and the impurities-doped amorphous silicon layer 50 are patterned through photolithography to thereby form a semiconductor pattern 42 and an ohmic contact pattern 52.

Figure 23A:
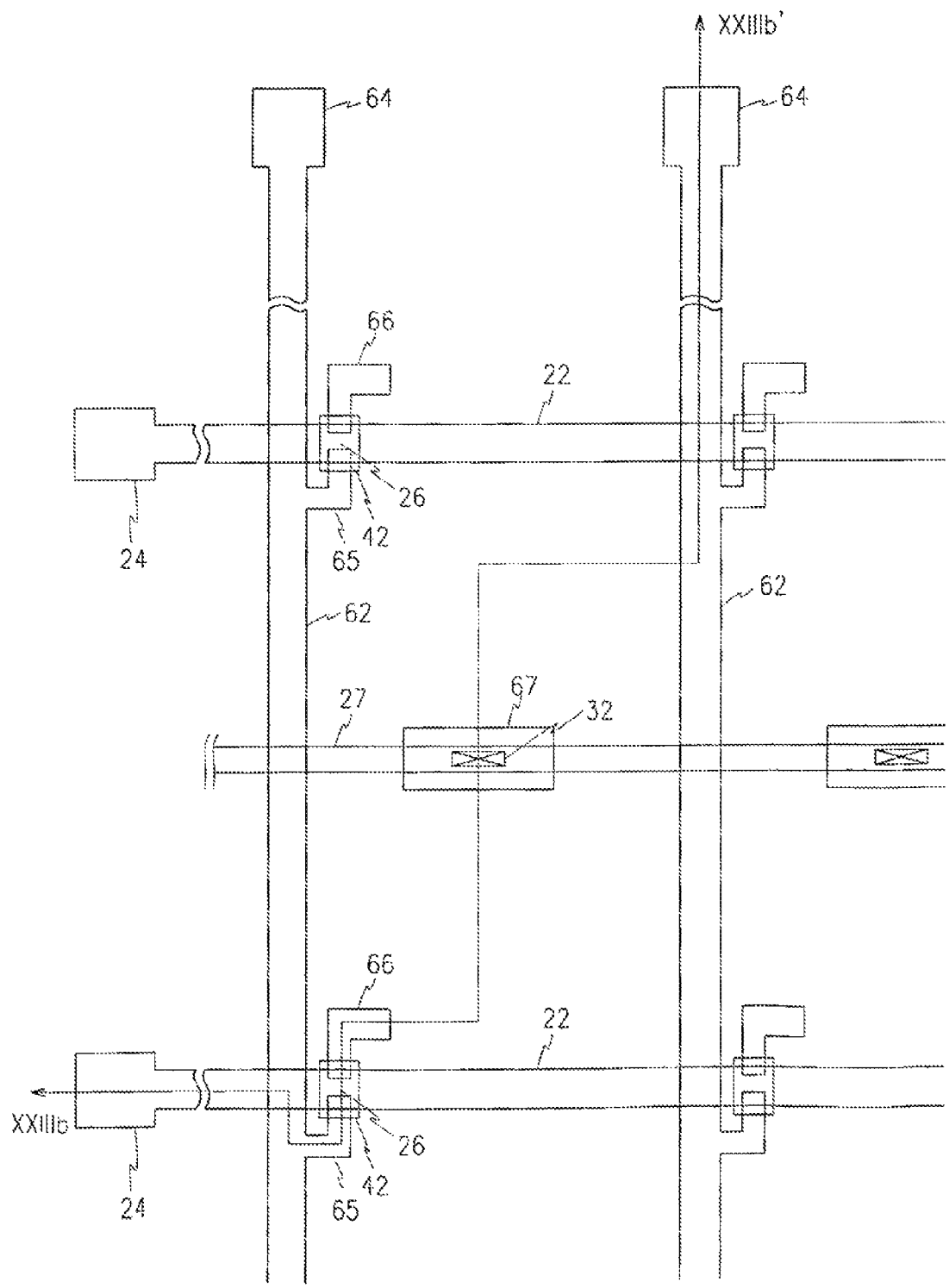
FIG. 23A illustrates the step of fabricating the thin film transistor array panel following the step illustrated in FIG. 22A.

As shown in FIGS. 23A and 23B, a metallic layer is deposited onto the entire surface of the substrate 10, and patterned through photolithography to thereby form a data line assembly, and storage capacitor conductive patterns 67. The data line assembly includes data lines 62, data pads 64, source electrodes 65, and drain electrodes 66. The storage capacitor conductive patterns 67 are connected to the storage capacitor electrode lines 27 through the first contact holes 32.

The ohmic contact pattern 52 is etched using the source electrode 65 and the drain electrode 66 as a mask to thereby separate it into a first portion 55 contacting the source electrode 65, and a second portion 56 contacting the drain electrode 66.

Figure 24A:
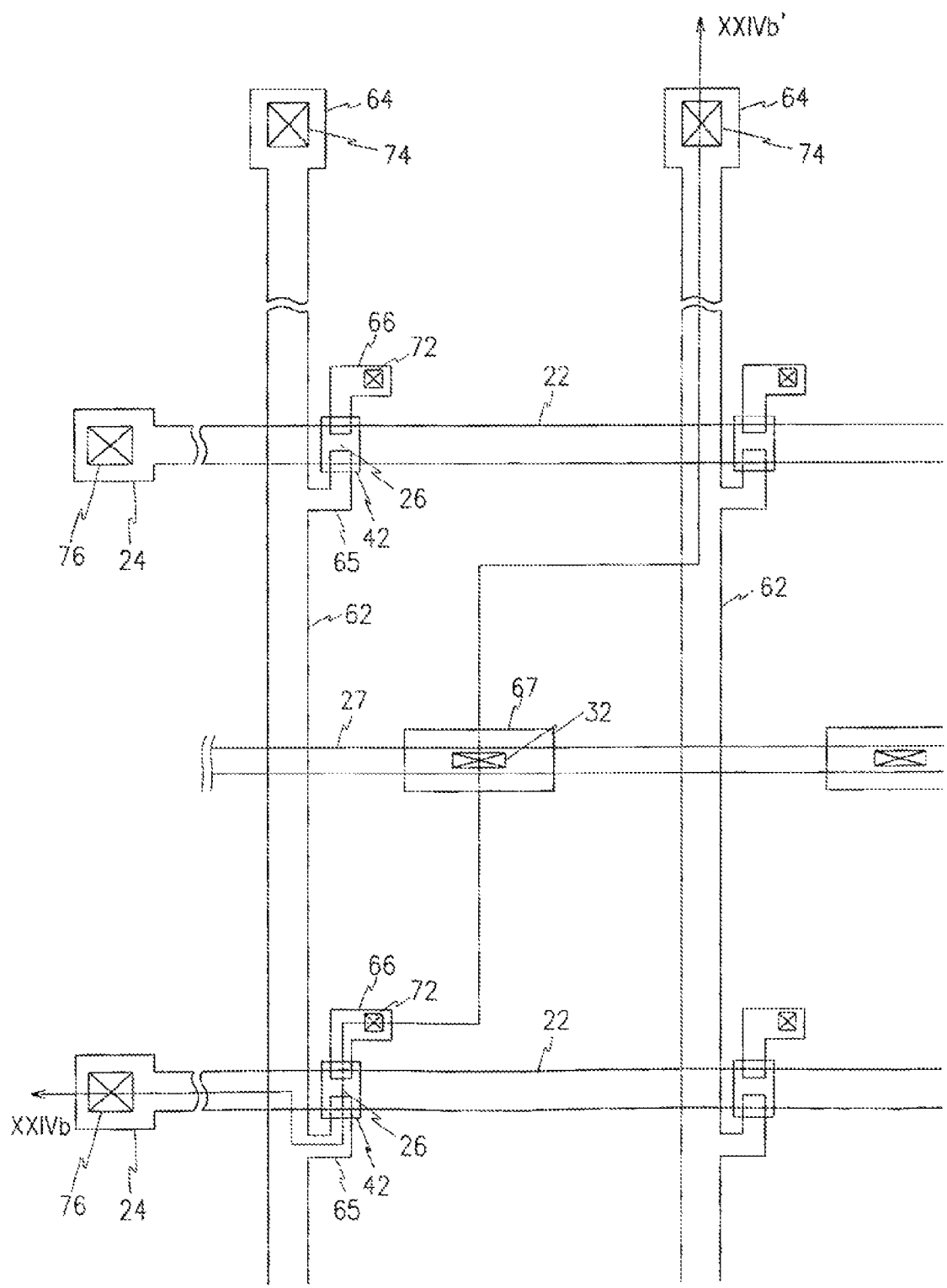
FIG. 24A illustrates the step of fabricating the thin film transistor array panel following the step illustrated in FIG. 23A.
Figure 24B:
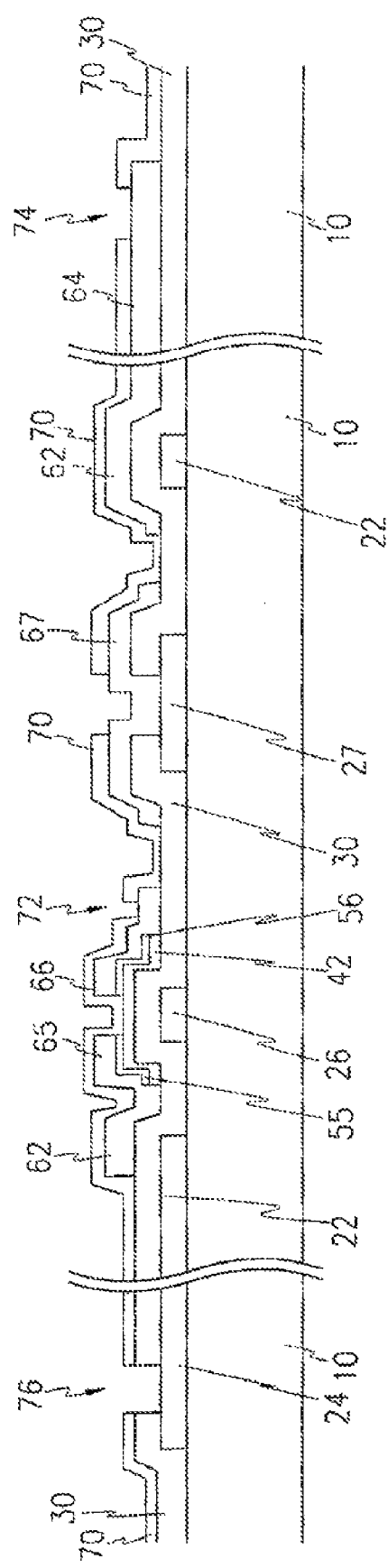
FIG. 24B is a cross sectional view of the thin film transistor array panel taken long the XXIVB-XXIVB' line of FIG. 24A.

As shown in FIGS. 24A and 24B, a passivation layer 70 is formed on the entire surface of the substrate 10 having the data line assembly, the storage capacitor conductive patterns 67 and the semiconductor pattern 42 with silicon nitride or silicon oxide. The passivation layer 70 and the gate insulating layer 30 are patterned through photolithography to thereby form second to fourth contact holes 72, 74 and 76. The second and the third contact holes 72 and 74 are formed at the passivation layer 70 while exposing the drain electrodes 66, and the data pads 64. The fourth contact holes 76 are formed at the passivation layer 70 and the gate insulating layer 30 while exposing the gate pads 24.

As shown in FIGS. 18 and 19, a transparent conductive layer based on ITO or IZO is deposited onto the entire surface of the substrate 10.

The transparent conductive layer is patterned through photolithography to thereby form pixel electrodes 82, subsidiary data pads 84, and subsidiary gate pads 86. The pixel electrodes 82 are connected to the drain electrodes 66 through the second contact holes 72. The subsidiary data and gate pads 64 and 66 are connected to the data and gate pads 64 and 24 through the third and the fourth contact holes 74 and 76.

In the preferred embodiment, the storage capacitor conductive patterns 67 are placed at the pixel regions between the neighboring gate lines. Alternatively, the storage capacitor conductive patterns 67 may be formed at the periphery of the pixel regions while bearing a bar shape.

Figure 25:
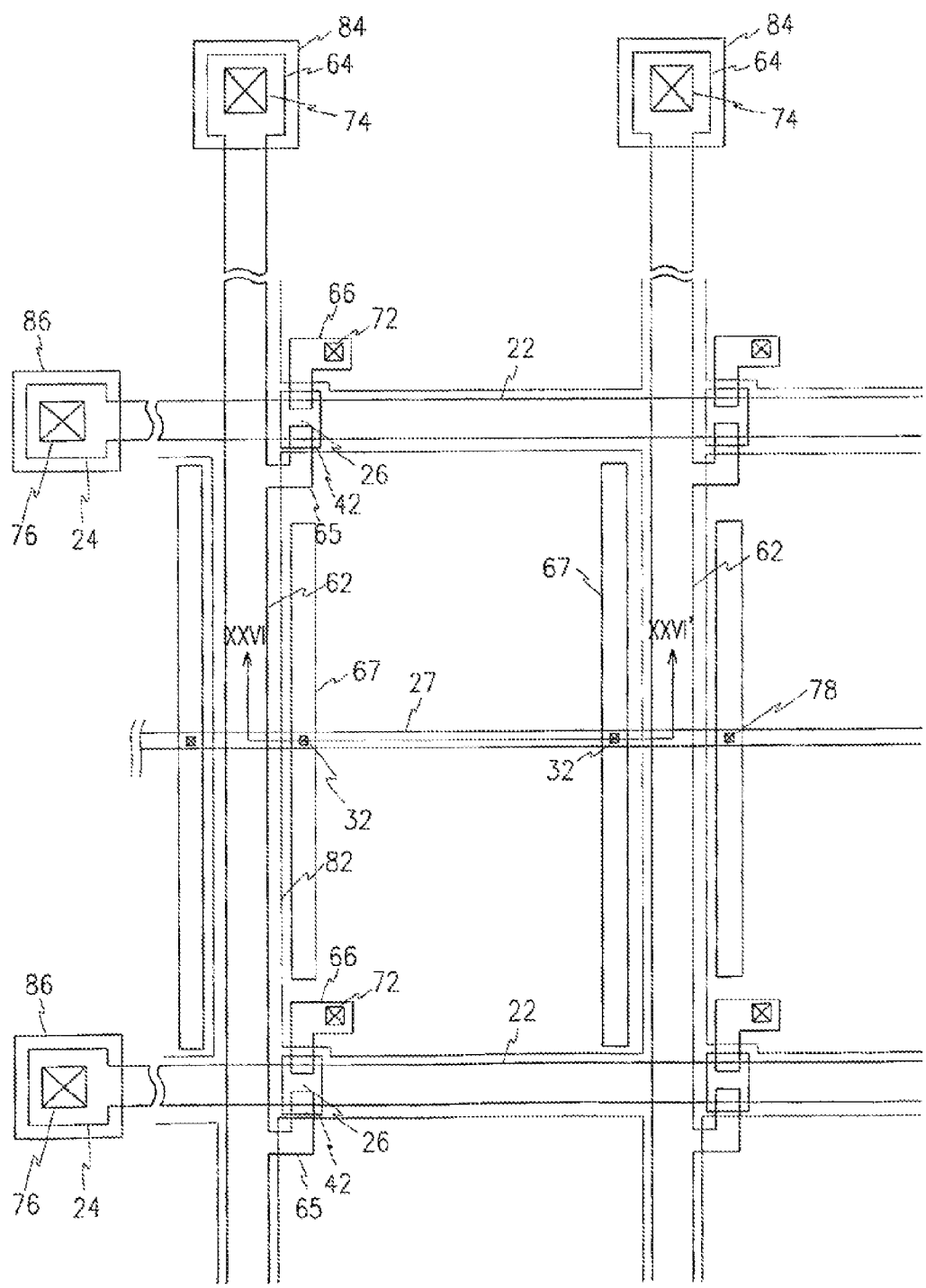
FIG. 25 is a plan view of a thin film transistor array panel according to a sixth preferred embodiment of the present invention.
Figure 26:
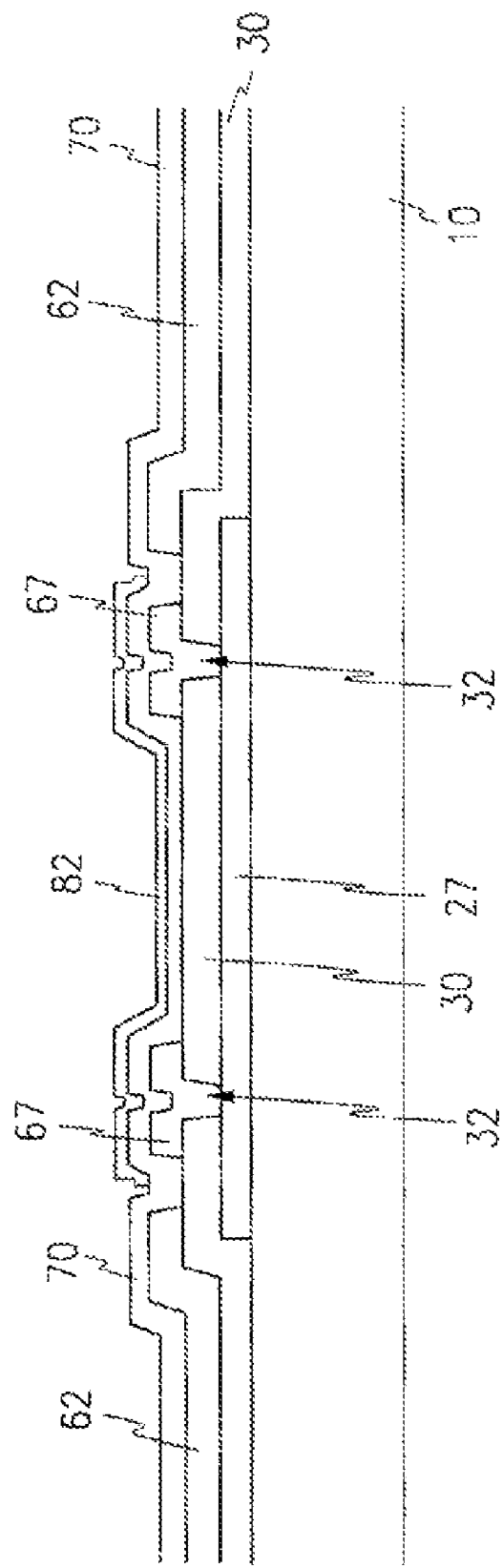
FIG. 26 is a cross sectional view of the thin film transistor array panel taken long the XXVI-XXVI' line of FIG. 25.

FIG. 25 is a plan view of a thin film transistor array panel according to a sixth preferred embodiment of the present invention, and FIG. 26 is a cross sectional view of the thin film transistor array panel taken along the XXVI-XXVI' line of FIG. 25.

In this preferred embodiment, the storage capacitor conductive patterns 67 are placed at both peripheral sides of the pixel regions while bearing a bar shape. The storage capacitor conductive patterns 67 are connected to the storage capacitor electrode lines 27 through the first contact holes 32 formed at the gate insulating layer 30.

The storage capacitor electrode lines 27 form storage capacitors in association with the pixel electrodes 82 while interposing the gate insulating layer 30 and the passivation layer 70. Furthermore, the storage capacitor conductive patterns 67 form other storage capacitors in association with the pixel electrodes 82 while interposing the passivation layer 70.

With such a structure, the electrostatic capacitance of the storage capacitors becomes increased even with the same overlapping area compared to the case where only the storage capacitor electrode liens 27 are overlapped with the pixel electrodes 82. Consequently, the aperture ratio with respect to the storage capacity becomes enhanced.

Furthermore, as the bar-shaped storage capacitor conductive patterns 67 are placed between the pixel electrodes 82 and the data lines 62, leakage of light between the pixel electrodes 82 and the data lines 62 can be prevented.

In the fifth and sixth preferred embodiments of the present invention, the storage capacitor line assembly is formed in a separate manner. Alternatively, parts of the gate lines may be utilized as the storage capacitor electrodes.

Figure 27:
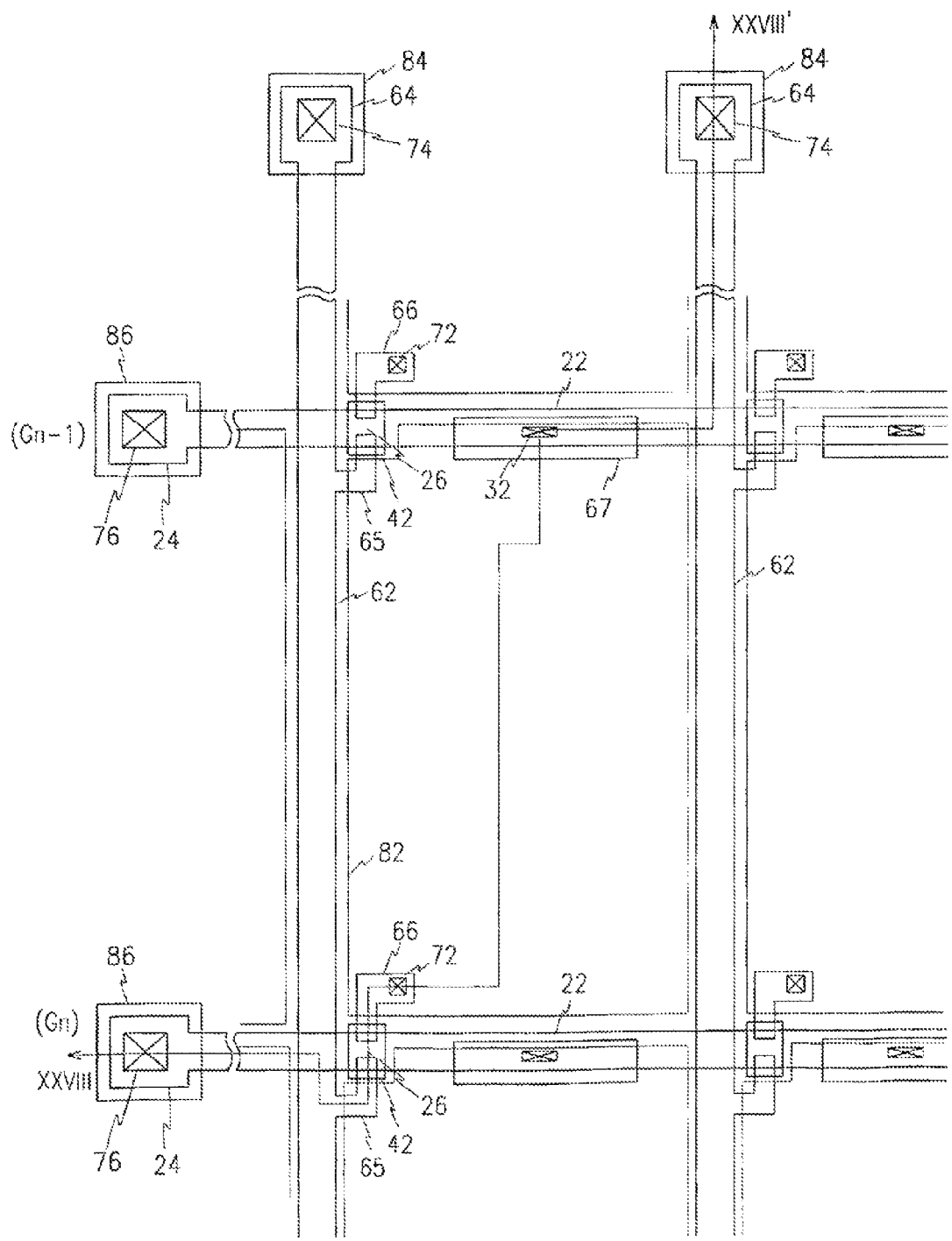
FIG. 27 is a plan view of a thin film transistor array panel according to a seventh preferred embodiment of the present invention.
Figure 28:
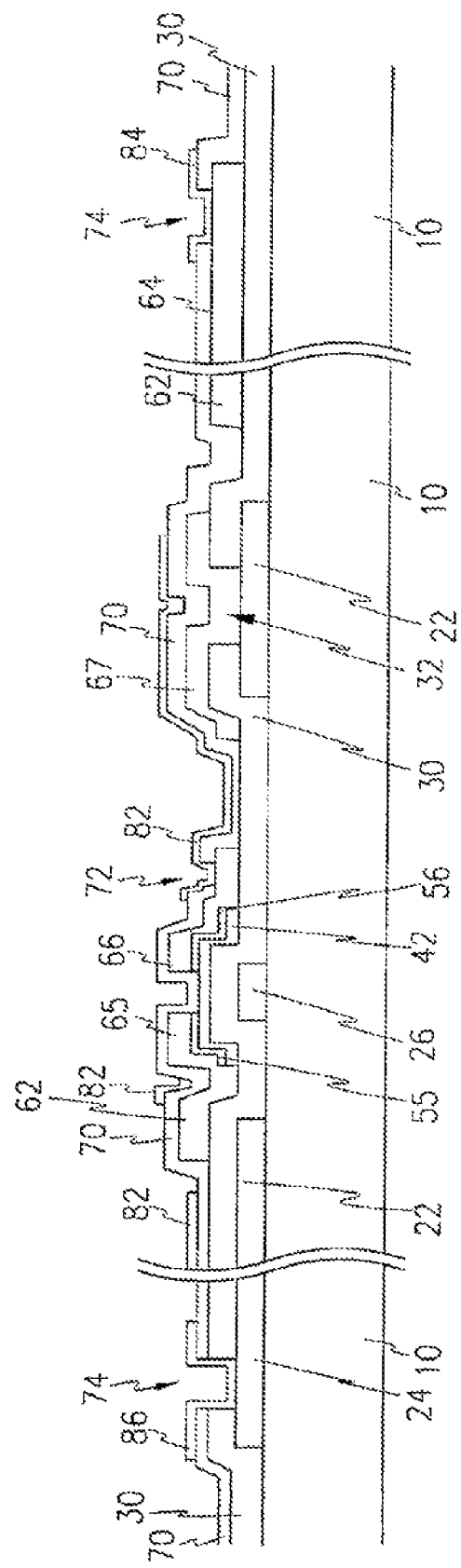
FIG. 28 is a cross sectional view of the thin film transistor array panel taken long the XXVIII-XXVIII' line of FIG. 27.

FIG. 27 is a plan view of a thin film transistor array panel according to a seventh preferred embodiment of the present invention, and FIG. 28 is a cross sectional view of the thin film transistor array panel taken along the XXVIII-XXVIII' line of FIG. 27.

In this preferred embodiment, the pixel electrodes arranged at any one gate line are overlapped with parts of the previous gate line to form storage capacitors. That is, parts of the gate lines are used to form the desired storage capacitors without forming a storage capacitor line assembly in a separate manner.

As shown in FIG. 27, the pixel electrodes 82 at the nth gate line 22 (Gn) are overlapped with the (n−1)th gate line 22 (Gn−1) while being extended in its area.

The storage capacitor conductive patterns 67 are partially overlapped with the gate lines 22 while interposing the gate insulating layer 30. The storage capacitor conductive patterns 67 are placed at the same plane as the data line assembly. The fourth contact holes 78 exposing the storage capacitor conductive patterns 67 are formed at the passivation layer 70. The storage capacitor conductive patterns 67 placed over the (n−1)th gate line 22 (Gn−1) are connected to the pixel electrodes 82 at the nth gate line 22 (Gn).

The storage capacitor conductive patterns 67 are overlapped with the gate lines 22 while interposing the gate insulating layer 30 to thereby form storage capacitors. The storage capacitor conductive patterns 68 placed over the (n−1)th gate line 22 (Gn−1) receive the relevant signals from the pixel electrodes 82 at the nth gate line 22 (Gn).

In the above structure, the storage capacity becomes significantly increased compared to the case where the storage capacitors are formed only through overlapping the pixel electrodes 82 with the gate lines 22. Furthermore, as a separate storage capacitor line assembly is not needed. the aperture ratio can be further enhanced.

The inventive structure may be well adapted for use with all of the liquid crystal display modes. Particularly, in case such a structure is employed for use with the optically compensated birefringence (OCB) mode, various advantages are resulted.

As the $\Delta \epsilon$ value of the liquid crystal is great with the OCB mode liquid crystal display, the difference between the dielectric constant at the initial state and the dielectric constant at the succeeding state as a function of the gray values is also great, and therefore, variation in the liquid crystal voltage is inevitably made to a large scale.

Figure 29:
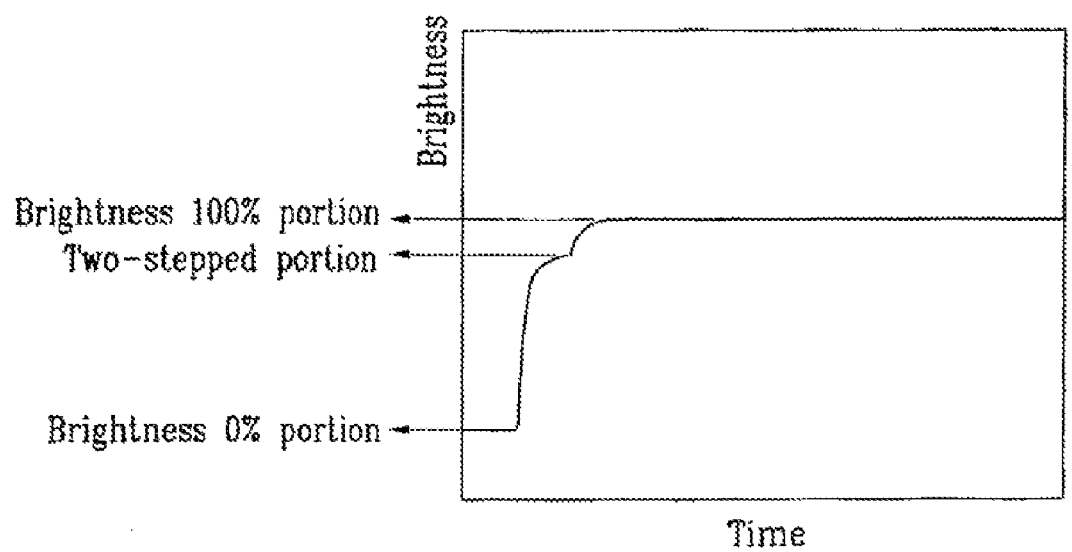
FIG. 29 illustrates a waveform curve of the response speed in a liquid crystal display.

Meanwhile, as shown in FIG. 29, the waveform (time-brightness) curve of the response speed measured with all of the liquid crystal display modes bears a two-stepped waveform exhibiting two stepped differences.

As the response speed is measured while altering the total brightness from 10% to 90%, it turns out to be slower in case the brightness at the two-stepped portion is less than 90%.

The OCB mode liquid crystal display exhibits a characteristic in that the two-stepped waveform occurs at the first frame, and a normal brightness is maintained at the second frame or the third frame. Therefore, in case the electrostatic capacitance at the two-stepped portion is increased to be 90% or more, particularly 95% or more, the desired normal brightness can be maintained at the first frame, thereby making rapid response speed.

Table 1 lists the brightness values at the two-stepped portion over the waveform (time-brightness) curve of the response speed as a function of the ratio of the electrostatic capacitance Cst of the storage capacitors to the electrostatic capacitance ClC of the liquid crystal in the OCB mode liquid crystal display.

TABLE 1

|  | Clc:Cst | |
| --- | --- | --- |
|  | 1.00:0.70 | 1.00:0.91 |
| Two-stepped portion (brightness %) | 81.8% | 87.3% |

It can be known from Table 1 that as the storage capacity Cst is increased, the brightness at the two-stepped portion is approximated to 90%. Therefore, the rapid response speed can be obtained through increasing the storage capacity such that the brightness at the two-stepped portion goes over 90%. Particularly, in case the storage capacity is increased such that the brightness at the two-stepped portion goes over 95%, the response speed can be further enhanced. In order to increase the storage capacity to such a degree, the storage capacitors according to the first to seventh preferred embodiments may be applied for use in the OCB mode liquid crystal display. That is, the storage capacitor electrode lines are formed at the same plane as the data line assembly such that they are overlapped with the pixel electrodes while interposing only the passivation layer. In the structure, the storage capacity as well as the aperture ratio are significantly enhanced without enlarging the area of the storage capacitor electrode lines, compared to the case where the storage capacitor electrode lines are formed at the same plane as the gate line assembly such that they are overlapped with the pixel electrodes while interposing the passivation layer and the gate insulating layer. As only one of the passivation layer and the gate insulating layer is disposed between the storage capacitor electrodes, it is not needed to enlarge the area of the storage capacitor electrode components. Consequently, the storage capacity can be increased without decreasing the aperture ratio.

As described above, with the inventive structure, the storage capacity can be increased without decreasing the aperture ratio while enhancing the response speed.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of fabricating a thin film transistor array panel, the method comprising:
    forming a gate line assembly and a storage capacitor line assembly on an insulating substrate such that the gate line assembly has a gate line and a gate electrode;
    forming a gate insulating layer such that the gate insulating layer covers the gate line assembly and the storage capacitor line assembly;
    forming a semiconductor pattern on the gate insulating layer;
    forming a data line assembly and a storage capacitor conductive pattern on the gate insulating layer overlaid with the semiconductor pattern such that the data line assembly has a data line, a source electrode and a drain electrode, and the storage capacitor conductive pattern are partially overlapped with the storage capacitor line assembly to thereby form a first storage capacitor;
    forming a passivation layer such that the passivation layer covers the data line assembly, the storage capacitor conductive pattern and the semiconductor pattern;
    forming first and second contact holes at the passivation layer such that the first and the second contact holes expose the drain electrodes and the storage capacitor conductive pattern, respectively; and
    forming a pixel electrode on the passivation layer such that the pixel electrode is connected to the drain electrode and the storage capacitor conductive patterns through the first and the second contact holes while forming a second storage capacitor in association with parts of the storage capacitor lines assembly,
    wherein the storage capacitor conductive pattern has an island shape.

2. The method of claim 1 wherein the storage capacitor line assembly has a storage capacitor electrode line proceeding parallel to the gate line, and a storage capacitor electrode pattern connected to the storage capacitor electrode line.

3. A method of fabricating a thin film transistor array panel, the method comprising:
    forming a gate line assembly on an insulating substrate such that the gate line assembly has a first gate line, a gate electrode connected to the first gate line, and a second gate line spaced apart from the first gate line with a predetermined distance while proceeding parallel to the first gate line;
    forming a gate insulating layer such that the gate insulating layer covers the gate line assembly;
    forming a semiconductor pattern on the gate insulating layer such that the semiconductor pattern is overlapped with the gate electrode;
    forming a data line assembly and a storage capacitor conductive pattern on the gate insulating layer overlaid with the semiconductor pattern such that the data line assembly has a data line crossing over the first and the second gate lines, a source electrode and a drain electrode, and the storage capacitor conductive pattern is partially overlapped with the second gate line to thereby form a first storage capacitor;
    forming a passivation layer such that the passivation layer covers the data line assembly, the storage capacitor conductive pattern and the semiconductor pattern;
    forming first and second contact holes at the passivation layer such that the first and the second contact holes expose the drain electrode and the storage capacitor conductive pattern, respectively; and
    forming a pixel electrodes electrode on the passivation layer such that the pixel electrode is connected to the drain electrode and the storage capacitor conductive pattern through the first and the second contact holes while forming a second storage capacitor in association with parts of the second gate line,
    wherein the storage capacitor conductive pattern has an island shape.

4. A method of fabricating a thin film transistor array panel, the method comprising:

forming a gate line assembly and a storage capacitor electrode line on an insulating substrate such that the gate line assembly has a gate line and a gate electrode;

forming a gate insulating layer such that the gate insulating layer covers the gate line assembly and the storage capacitor electrode line;

forming a first contact hole at the gate insulating layer such that the first contact hole expose the storage capacitor electrode line;

forming a semiconductor pattern on the gate insulating layer such that the semiconductor pattern is overlapped with the gate electrode;

forming a data line assembly and a storage capacitor conductive pattern on the gate insulating layer overlaid with the semiconductor pattern such that the data line assembly has a data line, a source electrode and a drain electrode, and the storage capacitor conductive pattern is connected to the storage capacitor electrode line through the first contact hole;

forming a passivation layer such that the passivation layer covers the data line assembly, the storage capacitor conductive pattern and the semiconductor pattern;

forming a second contact hole at the passivation layer such that the second contact hole exposes the drain electrode; and forming a pixel electrode on the passivation layer such that the pixel electrode is connected to the drain electrode through the second contact hole, the pixel electrode being overlapped with the storage capacitor conductive pattern to thereby form a first storage capacitor while being partially overlapped with the storage capacitor electrode line to thereby form second storage capacitor.

5. A method of fabricating a thin film transistor array panel, the method comprising:

forming a gate line assembly on an insulating substrate such that the gate line assembly has a first gate line, a gate electrode connected to the first gate line, and a second gate line spaced apart from the first gate line with a predetermined distance while proceeding parallel to the first gate line;

forming a gate insulating layer such that the gate insulating layer covers the gate line assembly;

forming a first contact hole at the gate insulating layer such that the first contact hole partially expose the second gate line;

forming a semiconductor pattern on the gate insulating layer such that the semiconductor pattern is overlapped with the gate electrode;

forming a data line assembly and a storage capacitor conductive pattern on the gate insulating layer overlaid with the semiconductor pattern such that the data line assembly has a data line crossing over the first and the second gate lines, a source electrode and a drain electrode, and the storage capacitor conductive pattern is connected to the second gate line through the first contact hole;

forming a passivation layer such that the passivation layer covers the data line assembly, the storage capacitor conductive pattern and the semiconductor pattern;

forming a second contact hole at the passivation layer such that the second contact hole exposes the drain electrode; and forming a pixel electrode on the passivation layer such that the pixel electrode is connected to the drain electrode through the second contact hole, the pixel electrode being overlapped with the storage capacitor conductive pattern to thereby form a first storage capacitor while being partially overlapped with the second gate line to thereby form a second storage capacitor.

* * * * *